(12) United States Patent
Im et al.

(10) Patent No.: US 12,249,674 B2
(45) Date of Patent: Mar. 11, 2025

(54) DISPLAY DEVICE

(71) Applicant: Samsung Display Co., LTD., Yongin-si (KR)

(72) Inventors: Hyun Deok Im, Seoul (KR); Jong Hyuk Kang, Suwon-si (KR); Hyun Min Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 448 days.

(21) Appl. No.: 17/786,332

(22) PCT Filed: Dec. 11, 2020

(86) PCT No.: PCT/KR2020/018165
§ 371 (c)(1),
(2) Date: Jun. 16, 2022

(87) PCT Pub. No.: WO2021/125705
PCT Pub. Date: Jun. 24, 2021

(65) Prior Publication Data
US 2024/0030385 A1 Jan. 25, 2024

(30) Foreign Application Priority Data

Dec. 17, 2019 (KR) .......................... 10-2019-0169223

(51) Int. Cl.
*H01L 33/38* (2010.01)
*H01L 25/16* (2023.01)
*H01L 33/62* (2010.01)

(52) U.S. Cl.
CPC .......... *H01L 33/387* (2013.01); *H01L 25/167* (2013.01); *H01L 33/62* (2013.01);
(Continued)

(58) Field of Classification Search
CPC ..... H01L 33/387; H01L 25/167; H01L 33/62; H01L 2933/0016; H01L 2933/0033;
(Continued)

(56) References Cited

U.S. PATENT DOCUMENTS

| 10,289,252 B2 | 5/2019 | Cok | |
|---|---|---|---|
| 2009/0316409 A1* | 12/2009 | Kim | ..................... H05K 1/0295 362/249.14 |

(Continued)

FOREIGN PATENT DOCUMENTS

| KR | 10-1490758 | 2/2015 |
|---|---|---|
| KR | 10-1730927 | 4/2017 |

(Continued)

OTHER PUBLICATIONS

International Search Report, with English translation, corresponding to International Application No. PCT/KR2020/018165 dated Apr. 5, 2021.

(Continued)

*Primary Examiner* — Victor A Mandala
(74) *Attorney, Agent, or Firm* — KILE PARK REED & HOUTTEMAN PLLC

(57) ABSTRACT

A display device includes a first electrode extending in a first direction; a second electrode extending in the first direction and spaced apart from, in a second direction, the first electrode; a light-emitting element having a shape extending in a direction and between the first and second electrodes such that the direction is parallel to the second direction; a first contact electrode having a shape extending in a third direction and having at least a portion on the first electrode; and a second contact electrode having a shape extending in the third direction, spaced apart from, in a fourth direction, the first contact electrode, and having at least a portion on the second electrode, the first contact electrode electrically (Continued)

contacts a side of the light-emitting element, and the second contact electrode electrically contacts another side of the light-emitting element.

20 Claims, 21 Drawing Sheets

(52) U.S. Cl.
CPC .............. *H01L 2933/0016* (2013.01); *H01L 2933/0033* (2013.01)

(58) Field of Classification Search
CPC ... H01L 33/20; H01L 25/0753; H01L 21/768; H01L 25/16; H01L 27/12; H01L 27/156; H01L 21/76895; H01L 27/124
See application file for complete search history.

(56) References Cited

U.S. PATENT DOCUMENTS

| | | | |
|---|---|---|---|
| 2017/0092827 A1* | 3/2017 | Ono | H05K 1/181 |
| 2018/0019369 A1* | 1/2018 | Cho | H01L 33/38 |
| 2019/0081261 A1* | 3/2019 | Lee | C09K 11/08 |
| 2019/0319168 A1* | 10/2019 | Kim | H01L 33/50 |
| 2020/0075667 A1* | 3/2020 | Lee | H01L 33/36 |
| 2021/0273131 A1* | 9/2021 | Kang | H01L 33/0095 |
| 2022/0037299 A1* | 2/2022 | Lee | H01L 27/124 |
| 2022/0069003 A1* | 3/2022 | Lee | H01L 33/005 |
| 2022/0069004 A1* | 3/2022 | Kang | H01L 25/0753 |

FOREIGN PATENT DOCUMENTS

| | | |
|---|---|---|
| KR | 10-2018-0007025 | 1/2018 |
| KR | 10-2018-0009015 | 1/2018 |
| KR | 10-2018-0071465 | 6/2018 |
| KR | 10-2018-0072909 | 7/2018 |
| WO | 2015-005654 | 1/2015 |

OTHER PUBLICATIONS

Written Opinion, with English translation, corresponding to International Application No. PCT/KR2020/018165, dated Apr. 5, 2021.

* cited by examiner

DISPLAY DEVICE

CROSS-REFERENCE TO RELATED APPLICATION(S)

This application is a national entry of International Application No. PCT/KR2020/018165, filed on Dec. 11, 2020, which claims under 35 U.S.C. § 119(a) and 365(b) priority to and benefits of Korean Patent Application No. 10-2019-0169223, filed on Dec. 17, 2019 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, for example, light emitting diodes (LED), and examples of the light emitting diode include an organic light emitting diode (OLED) using an organic material as a fluorescent material and an inorganic light emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device including a contact electrode having a shape extending in a direction inclined with respect to an electrode to correspond to a shape of a light-emitting element.

Aspects of the disclosure also provide a display device having a novel electrode structure including a light-emitting element and electrodes electrically connected to the light-emitting element.

It should be noted that aspects of the disclosure are not limited thereto and other aspects will be apparent to those of ordinary skill in the art from the following description.

According to an embodiment, a display device may include a first electrode extending in a first direction; a second electrode extending in the first direction and spaced apart from the first electrode in a second direction intersecting the first direction; a light-emitting element having a shape extending in one direction and disposed between the first electrode and the second electrode and the one direction is parallel to the second direction; a first contact electrode having a shape extending in a third direction intersecting the first direction and the second direction and including at least a portion disposed on the first electrode; and a second contact electrode having a shape extending in the third direction, spaced apart from the first contact electrode in a fourth direction intersecting the third direction, and including at least a portion disposed on the second electrode, wherein the first contact electrode electrically contacts a side of the light-emitting element, and the second contact electrode electrically contacts another side of the light-emitting element.

Each of the first contact electrode and the second contact electrode may have a shape extending in the third direction that forms an inclination angle with the first direction in which the first electrode and the second electrode extend.

The first inclination angle may be in a range of about 100 to about 80°.

The light-emitting element may include a first end surface and a second end surface in the one direction, the first contact electrode may electrically contact a portion of the first end surface, and the second contact electrode may electrically contact a portion of the second end surface.

The light-emitting element may further include a third end surface and a fourth end surface in another direction intersecting the one direction, the first contact electrode may partially and electrically contact the third end surface, and the second contact electrode may partially and electrically contact the fourth end surface.

The light-emitting element may include a first semiconductor layer; a second semiconductor layer; and an active layer disposed between the first semiconductor layer and the second semiconductor layer, and the light-emitting element may include a first light-emitting element disposed such that a surface of an active layer of the first light-emitting element faces the first direction; and a second light-emitting element disposed such that a surface of an active layer of the second light-emitting element faces the second direction.

A lower surface of a first semiconductor layer of the first light-emitting element may include the second end surface electrically contacting the second contact electrode.

A lower surface of a first semiconductor layer of the second light-emitting element may include the fourth end surface electrically contacting the second contact electrode in the second light-emitting element.

A first length in the first direction and a second length in the second direction may be defined in the light-emitting element, and a separation distance between the first contact electrode and the second contact electrode may satisfy $$DC \leq LD \sin \theta c + HD \cos \theta c - 2LCD \sin \theta c$$

(wherein, "DC" is the separation distance between the first contact electrode and the second contact electrode, "LD" is the first length of the light-emitting element, "HD" is the second length of the light-emitting element, "LCD" is a length of a contact area in which an end surface of the light-emitting element electrically contacts the contact electrode, and "θc" is an inclination angle between an extending direction of the contact electrode and an extending direction of the electrode.)

The second length of the light-emitting element may be greater than a separation distance between the first electrode and the second electrode.

The first length may be equal to the second length in the light-emitting element.

A width of each of the first contact electrode and the second contact electrode may be greater than a value obtained by dividing the length of the contact area by a sine value of the inclination angle.

A length of each of the first contact electrode and the second contact electrode may be greater than a value obtained by dividing the length of the contact area by a cosine value of the inclination angle.

The first length may be greater than the second length in the light-emitting element.

According to an embodiment, a display device may include a first electrode including a portion extending in a first direction; a second electrode including a portion extending in the first direction and spaced apart from and facing the first electrode in a second direction intersecting the first direction; a light-emitting element disposed between the first electrode and the second electrode; a first contact electrode having a shape extending in a third direction that forms an inclination angle with the first direction, and the first contact electrode including at least a portion disposed on the first electrode; and a second contact electrode having a shape extending in the third direction, spaced apart from the first contact electrode, and the second contact electrode including at least a portion disposed on the second electrode, wherein the first contact electrode electrically contacts a side of the light-emitting element, the second contact electrode electrically contacts another side of the light-emitting element, and the inclination angle is in a range of about 100 to about 80°.

The first electrode may include a first electrode expansion portion; and a first electrode connection portion, a width of the first electrode connection portion in the second direction being less than a width of the first electrode expansion portion in the second direction, the second electrode may include a second electrode expansion portion; and a second electrode connection portion, a width of the second electrode extension portion in the second direction may be less than a width of the second electrode expansion portion in the second direction, and a first separation distance between the first electrode expansion portion and the second electrode expansion portion may be less than a second separation distance between the first electrode connection portion and the second electrode connection portion.

The light-emitting element may be disposed between the first electrode expansion portion and the second electrode expansion portion, the first contact electrode may electrically contact the side of the light-emitting element on the first electrode expansion portion, and the second contact electrode may electrically contact the another side of the light-emitting element on the second electrode expansion portion.

A length of each of the first electrode expansion portion and the second electrode expansion portion, in the first direction, may be greater than a length of the light-emitting element in the first direction and less than a sum of a length of the light-emitting element and a length of a portion in which an end surface of the light-emitting element electrically contacts the first contact electrode.

The first electrode may include a first electrode extension portion extending in the first direction; and a first electrode bent portion bent in the second direction from the first electrode extension portion, the first electrode extension portion may be spaced apart from the second electrode in the second direction, at least a portion of the first electrode bent portion may overlap the second electrode in a thickness direction, and the light-emitting element may be disposed between the first electrode extension portion, the first electrode bent portion, and the second electrode.

The second electrode may include a second electrode extension portion extending in the first direction; and a second electrode bent portion bent in the second direction from the second electrode extension portion, the second electrode extension portion may be spaced apart from the first electrode extension portion, the second electrode bent portion may be spaced apart from the first electrode bent portion, and the light-emitting element may be disposed between the first electrode bent portion and the second electrode bent portion.

The details of other embodiments are included in the detailed description and the accompanying drawings.

A display device according to one embodiment can include electrodes extending in one or in a direction, light-emitting elements disposed between the electrodes, and contact electrodes each having a shape extending in a direction inclined with respect to the one direction. The contact electrodes can be partially in contact with both sides of the light-emitting elements in a diagonal direction. Even though each of the light-emitting elements has a relatively small height and length, the contact electrodes are in contact with the light-emitting elements in a direction diagonal to a direction in which the light-emitting elements extend, so that a separation distance between the contact electrodes can be secured above a certain level, which is advantageous in process.

Accordingly, in the display device, the electrodes and the contact electrodes can have a novel arrangement structure.

The effects according to the embodiments are not limited by the above contents, and more various effects are included in this disclosure.

BRIEF DESCRIPTION OF DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
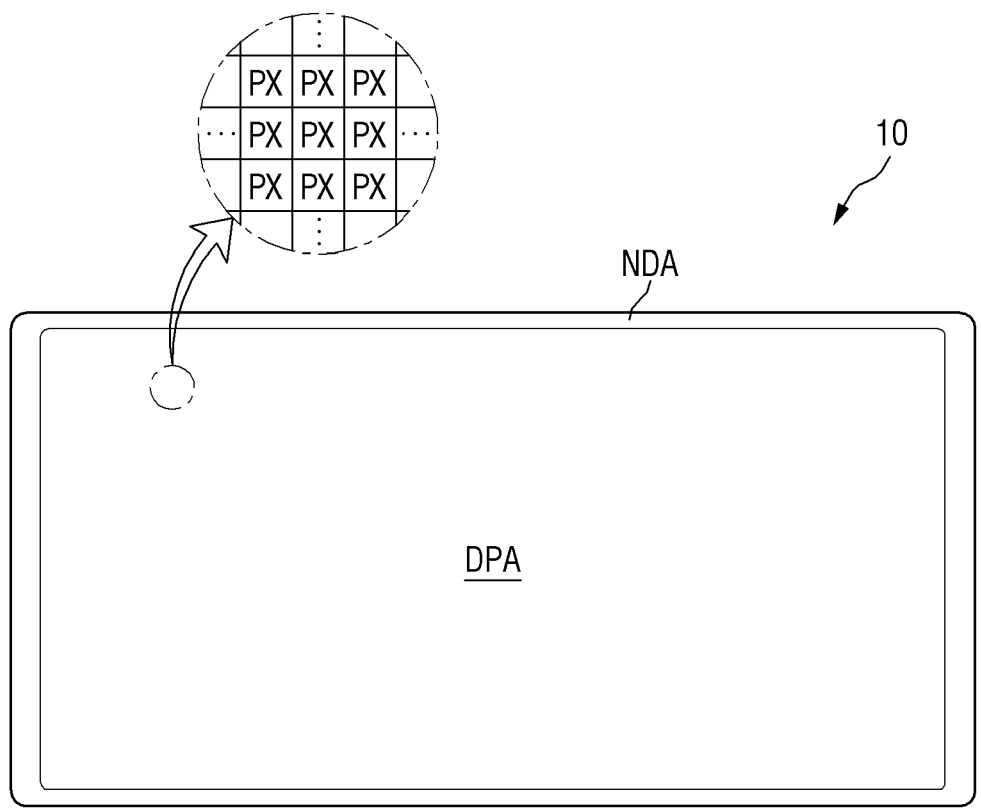
FIG. 1 is a schematic plan view of a display device according to one embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that in case that a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to one embodiment.

Referring to FIG. 1, a display device 10 displays a video or a still image. The display device 10 may refer to all electronic devices that provide a display screen. For example, the display device 10 may include a television, a notebook, a monitor, an advertising board, an Internet of Things (IoT) device, a mobile phone, a smart phone, a tablet personal computer (PC), an electronic watch, a smart watch, a watch phone, a head mounted display, a mobile communication terminal, an electronic organizer, an electronic book reader, a portable multimedia player (PMP), a navigation device, a game machine, a digital camera, a camcorder, and the like, which provide display screens.

The display device 10 may include a display panel that provides a display screen. Examples of the display panel may include an inorganic light-emitting diode display panel, an organic light-emitting display panel, a quantum dot light-emitting display panel, a plasma display panel, a field emission display panel, and the like within the spirit and the scope of the disclosure. Hereinafter, although a case in which the inorganic light-emitting diode display panel as an example of the display panel is applied is described, the disclosure is not limited thereto, and may be applied to other display panels.

A shape of the display device 10 may be variously modified. For example, the display device 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like within the spirit and the scope of the disclosure. A shape of a display region DPA of the display device 10 may also be similar to the overall shape of the display device 10. In FIG. 1, the display device 10 and the display region DPA, which have a rectangular shape of which lateral sides are long, are illustrated. It is to be understood that the shapes disclosed through the specification include shapes that are also substantial to the shapes disclosed herein.

The display device 10 may include the display region DPA and a non-display region NDA. The display region DPA is a region in which an image may be displayed, and the non-display region NDA is a region in which an image is not displayed. The display region DPA may refer to an active region and the non-display region NDA may refer to an inactive region. The display region DPA may generally occupy a center of the display device 10.

The display region DPA may include pixels PX. The pixels PX may be arranged (or disposed) in a matrix direction. A shape of each of the pixels PX may be a rectangular shape or a square shape in a plan view, but the disclosure is not limited thereto, and the shape may be a rhombus shape of which each side is inclined with respect to one direction or a direction. The pixels PX may be alternately arranged (or disposed) in a stripe type or a PENTILE™ type. Each of the pixels PX may include one or more light-emitting elements 300 that emit light in a specific wavelength range, thereby displaying a specific color.

The non-display region NDA may be disposed around the display region DPA. The non-display region NDA may completely or partially surround the display region DPA. The display region DPA may have a rectangular shape, and the non-display region NDA may be disposed adjacent to four sides of the display region DPA. The non-display region NDA may form a bezel of the display device 10. In each non-display region NDA, lines or circuit driving parts included in the display device 10 may be disposed, or external devices may be mounted.

Figure 2:
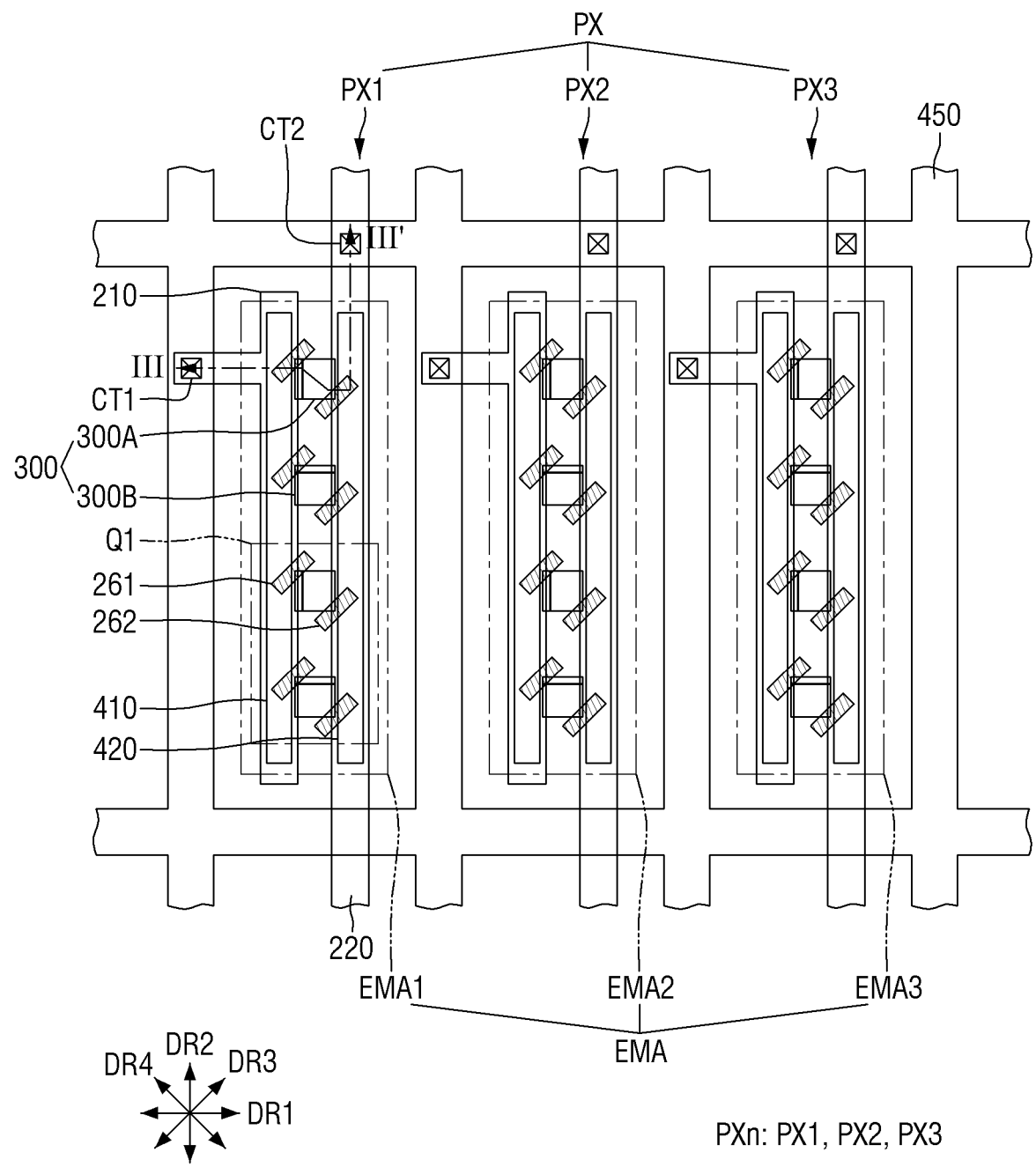
FIG. 2 is a schematic plan view illustrating one pixel of the display device according to one embodiment.

FIG. 2 is a schematic plan view illustrating one pixel of the display device according to one embodiment.

Referring to FIG. 2, the display device 10 may include the pixels PX, and each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the disclosure is not limited thereto, and the sub-pixels PXn may emit light having a same color. In FIG. 2, one pixel PX is illustrated as including three sub-pixels PXn, but is not limited thereto, and may include a larger number of sub-pixels PXn.

Each of the sub-pixels PXn of the display device 10 may include a region defined as a light-emitting region EMA. The first sub-pixel PX1 may include a first light-emitting region EMA1, the second sub-pixel PX2 may include a second light-emitting region EMA2, and the third sub-pixel PX3 may include a third light-emitting region EMA3. The light-emitting region EMA may be defined as a region in which the light-emitting element 300 included in the display device 10 is disposed to emit light in a specific wavelength range. The light-emitting element 300 may include an active layer 330 (see FIG. 4), and the active layer 330 may emit light in a specific wavelength range without directivity. The light emitted from the active layer 330 of the light-emitting element 300 may also be emitted in directions toward side surfaces of the light-emitting element 300 including both ends thereof. The light-emitting region EMA may include a region in which the light-emitting element 300 is disposed, and may include a region which is adjacent to the light-emitting element 300 and through which the light emitted from the light-emitting element 300 is emitted.

The disclosure is not limited thereto, and the light-emitting region EMA may also include a region in which the light emitted from the light-emitting element 300 is reflected or refracted due to another member to be emitted. Light-emitting elements 300 may be disposed in each sub-pixel PXn, and the region in which the light-emitting elements 300 are disposed and a region adjacent to the region form the light-emitting region EMA.

Although not shown in the drawing, each of the sub-pixels PXn of the display device 10 may include a non-light-emitting region which is defined as a region except for the light-emitting region EMA. The non-light-emitting region may be a region in which the light-emitting elements 300 are not disposed and the light emitted from the light-emitting elements 300 does not reach so that light is not emitted. In the non-light-emitting region, a region in which layers disposed below a layer, on which the light-emitting elements 300 are disposed, are partially patterned may be formed. During a manufacturing process of the display device 10, after the light-emitting elements 300 are disposed, some (or a number of or part of) lines disposed below the light-emitting elements 300 may be patterned. The patterning may be performed in the non-light-emitting region, in which the light-emitting elements 300 are not disposed, in each sub-pixel PXn. A detailed description thereof will be provided below Each of the sub-pixels PXn of the display device 10 may include electrodes 210 and 220, the light-emitting elements 300, and contact electrodes 261 and 262. The display device 10 may further include an outer bank 450 disposed to surround each sub-pixel PXn, and inner banks 410 and 420 disposed below the electrodes 210 and 220. According to one embodiment, the display device 10 may include the electrodes 210 and 220 disposed to extend in one direction or a direction, and the contact electrodes 261 and 262 each having a shape extending in a direction crossing or intersecting the one direction or a direction.

For example, the electrodes 210 and 220 of the display device 10 may include a first electrode 210 and a second electrode 220. The first electrode 210 and the second electrode 220 may be disposed in each sub-pixel PXn, and may each be disposed to extend in one direction or a direction and to be spaced apart from each other and face each other in another direction crossing or intersecting the one direction or a direction.

The first electrode 210 may be disposed in each sub-pixel PXn in a form extending in a second direction DR2. However, the first electrode 210 may not extend to another sub-pixel PXn adjacent in the second direction DR2, and may be disposed to be partially spaced apart from the outer bank 450 surrounding each sub-pixel PXn. In an embodiment, the first electrode 210 may further include a portion disposed to overlap the outer bank 450, and the first electrode 210 may be electrically connected to a circuit element layer included in the display device 10 at a portion overlapping the outer bank 450.

The second electrode 220 may be disposed to extend in the second direction DR2 in each sub-pixel PXn. Unlike the first electrode 210, the second electrode 220 may be disposed to extend to another sub-pixel PXn adjacent in the second direction DR2. For example, one connected second electrode 220 may be disposed in the sub-pixels PXn adjacent in the second direction DR2. The second electrode 220 may partially overlap the outer bank 450 at a boundary of the sub-pixels PXn adjacent in the second direction DR2, and the second electrode 220 may be electrically connected to the circuit element layer included in the display device 10 in a portion overlapping the outer bank 450.

According to one embodiment, the first electrode 210 and the second electrode 220 of the display device 10 may be disposed to extend in one direction or a direction and to be spaced apart from each other and face each other in another direction crossing or intersecting the one direction or a direction. For example, the first electrode 210 and the second electrode 220 may have a shape extending in the second direction DR2, and may be disposed to be spaced apart from each other in a first direction DR1. In the drawing, the first electrode 210 and the second electrode 220 are illustrated as being disposed to be spaced apart from each other in a direction perpendicular to an extending direction thereof, but the disclosure is not limited thereto. As long as the first electrode 210 and the second electrode 220 may be disposed to be spaced apart from each other in a direction different from the extending direction thereof, an angle formed by the direction and the extending direction is not particularly limited.

However, the shape of each of the first electrode 210 and the second electrode 220 is not limited thereto. Each of the first electrode 210 and the second electrode 220 may further include a stem portion extending in the first direction DR1. In the first electrode 210, different stem portions may be disposed for each sub-pixel PXn, and in the second electrode 220, one stem portion extends to the sub-pixels PXn adjacent in the first direction DR1 so that the second electrodes 220 of the sub-pixels PXn may be electrically connected to each other through the stem portion. The second electrode 220 may be electrically connected to circuit elements in the non-display region NDA located at a peripheral portion of the display region DPA in which the pixels PX or sub-pixels PXn are disposed.

In the drawing, it is illustrated that one first electrode 210 and one second electrode 220 are disposed in each sub-pixel PXn, but the disclosure is not limited thereto. In an embodiment, a larger number of first electrodes 210 and second electrodes 220 may be disposed in each sub-pixel PXn. In an embodiment, in case that the display device 10 may include first electrodes 210 and second electrodes 220, the first electrodes 210 and the second electrodes 220 may each have different widths. For example, in the first electrodes 210 and the second electrodes 220, one first electrode 210 and one second electrode 220 may have greater widths than another first electrode 210 and another second electrode 220, respectively. The disclosure is not limited thereto, and the first electrodes 210 may each have a greater width than each of the second electrodes 220, and vice versa.

The first electrode 210 and the second electrode 220 disposed in each sub-pixel PXn may not necessarily have a shape extending in one direction or a direction, and the first electrode 210 and the second electrode 220 may be disposed in various structures. For example, the first electrode 210 and the second electrode 220 may each have a partially curved or bent shape, and one electrode of the first electrode 210 and the second electrode 220 may also be disposed to surround the other electrode thereof. As long as at least a partial region of the first electrode 210 and at least a partial region of the second electrode 220 are spaced apart from each other and face each other to form a region in which the light-emitting element 300 is to be disposed therebetween, the arrangement structures and shapes of the first electrode 210 and the second electrode 220 are not particularly limited.

The electrodes 210 and 220 may be electrically connected to the light-emitting elements 300 and may receive a voltage to allow the light-emitting element 300 to emit light. For example, the electrodes 210 and 220 may be electrically connected to the light-emitting element 300 through the contact electrodes 261 and 262, which will be described below, and may transmit an electrical signal applied to the electrodes 210 and 220 to the light-emitting element 300 through the contact electrodes 261 and 262.

In an embodiment, the first electrode 210 may be a pixel electrode separated for each sub-pixel PXn, and the second electrode 220 may be a common electrode connected in common along each sub-pixel PXn. One of the first electrode 210 and the second electrode 220 may be an anode of the light-emitting element 300, and the other one thereof may be a cathode of the light-emitting element 300. However, the disclosure is not limited thereto, and the reverse of the above description may be possible.

Further, each of the electrodes 210 and 220 may be utilized to form an electric field in the sub-pixel PXn, thereby aligning the light-emitting element 300. The light-emitting element 300 may be disposed between the first electrode 210 and the second electrode 220 through a process of forming an electric field between the first electrode 210 and the second electrode 220 by applying an alignment signal to the first electrode 210 and the second electrode 220. The light-emitting elements 300 may be sprayed onto the first electrode 210 and the second electrode 220 in a state of being dispersed in ink through an inkjet printing process, and may be aligned between the first electrode 210 and the second electrode 220 through a method of applying a dielectrophoretic force to the light-emitting elements 300 by applying the alignment signal between the first electrode 210 and the second electrode 220.

As will be described below, the first electrode 210 and the second electrode 220 may be disposed on the inner banks 410 and 420. The inner banks 410 and 420 may include a first inner bank 410 on which the first electrode 210 is disposed and a second inner bank 420 on which the second electrode 220 is disposed.

The first inner bank 410 and the second inner bank 420 may have similar shapes to the first electrode 210 and the second electrode 220, respectively. For example, the first inner bank 410 and the second inner bank 420 may each have a shape extending in the second direction DR2 and may be disposed to be spaced apart from each other and face each other in the first direction DR1. The first inner bank 410 and the second inner bank 420 may extend in the second direction DR2, and may be spaced apart from each other and terminated at a boundary between the sub-pixels PXn so as not to extend to another sub-pixel PXn adjacent in the second direction DR2. Accordingly, the first inner bank 410 and the second inner bank 420 may be disposed in each sub-pixel PXn to form a pattern on the entire surface of the display device 10. By disposing the inner banks 410 and 420 to be spaced apart from each other and face each other, a region in which the light-emitting element 300 is disposed may be formed therebetween. In the drawing, it is illustrated that one first inner bank 410 and one second inner bank 420 are disposed, but the disclosure is not limited thereto. A larger number of inner banks 410 and 420 may be further disposed according to the number of electrodes 210 and 220, which will be described below.

The light-emitting elements 300 may be disposed between the first electrode 210 and the second electrode 220. As an example, the light-emitting elements 300 may be disposed to be spaced apart from each other between the first electrode 210 and the second electrode 220. However, a separation distance between the light-emitting elements 300 is not particularly limited. The light-emitting elements 300 may be disposed adjacent to each other to form a group, and other light-emitting elements 300 may be grouped in a state of being spaced apart at an interval and may be disposed to have a non-uniform density.

The light-emitting element 300 may have a shape extending in at least one direction or a direction, and the light-emitting element 300 may be disposed such that the one direction or a direction is parallel to a direction in which the first electrode 210 and the second electrode 220 are spaced apart from each other, for example, the first direction DR1. The light-emitting element 300 may be disposed such that one end or an end thereof in the one direction or a direction is placed on the first electrode 210 and the other end or another end thereof in the one direction or a direction is placed on the second electrode 220. However, the disclosure is not limited thereto.

The light-emitting elements 300 according to one embodiment may include active layers 330 having different materials to emit light in different wavelength ranges to the outside. The display device 10 according to one embodiment may include the light-emitting elements 300 emitting light in different wavelength ranges. The light-emitting element 300 of the first sub-pixel PX1 may include an active layer 330 that emits light of a first color having a first wavelength at a central wavelength range, the light-emitting element 300 of the second sub-pixel PX2 may include an active layer 330 that emits light of a second color having a second wavelength at a central wavelength range, and the light-emitting element 300 of the third sub-pixel PX3 may include an active layer 330 that emits light of a third color having a third wavelength at a central wavelength range.

Thus, the light of the first color may be emitted from the first sub-pixel PX1, the light of the second color may be emitted from the second sub-pixel PX2, and the light of the third color may be emitted from the third sub-pixel PX3. In an embodiment, the light of the first color may be blue light having a central wavelength range ranging from about 450 nm to about 495 nm, the light of the second color may be green light having a central wavelength range ranging from about 495 nm to about 570 nm, and the light of the third color may be red light having a central wavelength range ranging from about 620 nm to about 752 nm. However, the disclosure is not limited thereto. The first sub-pixel PX1, the second sub-pixel PX2, and the third sub-pixel PX3 may include a same type of light-emitting elements 300 to emit light of substantially a same color.

The contact electrodes 261 and 262 may be disposed on the respective electrodes 210 and 220. The contact electrodes 261 and 262 may be disposed in each sub-pixel PXn to correspond to the light-emitting element 300. The contact electrodes 261 and 262 may be electrically connected to the light-emitting element 300 and the electrodes 210 and 220. For example, the contact electrodes 261 and 262 may be in contact with and electrically connected to the first electrode 210 and the second electrode 220, respectively, and the light-emitting element 300.

The contact electrodes 261 and 262 may include a first contact electrode 261 and a second contact electrode 262, and the first contact electrode 261 and the second contact electrode 262 may be spaced apart from each other to be disposed on one side or a side and the other side or another side of the light-emitting element 300, respectively. For example, the first contact electrode 261 may partially cover or overlap one side or a side of the light-emitting element 300 and at least a partial region thereof may be disposed on the first electrode 210, and the second contact electrode 262 may partially cover or overlap the other side or another side of the light-emitting element 300 and at least a partial region thereof may be disposed on the second electrode 220. Accordingly, the light-emitting element 300 may be electrically connected to the electrodes 210 and 220 respectively through the contact electrodes 261 and 262.

According to one embodiment, the contact electrodes 261 and 262 of the display device 10 may each have a shape extending in a third direction DR3 crossing or intersecting the first direction DR1 and the second direction DR2. The first contact electrode 261 and the second contact electrode 262 may be disposed to be spaced apart from each other in a fourth direction DR4 crossing or intersecting the third direction DR3. The contact electrodes 261 and 262 may each have a shape extending in a direction different from that of each of the first electrode 210 and the second electrode 220. For example, the direction in which the contact electrodes 261 and 262 extend may be a direction crossing or intersecting the direction in which the electrodes 210 and 220 extend and the direction in which the electrodes 210 and 220 are spaced apart from each other. For example, the contact electrodes 261 and 262 may each have a shape extending in a direction diagonal or oblique to the direction in which the electrodes 210 and 220 extend. The contact electrodes 261 and 262 may be disposed on the electrodes 210 and 220, respectively, and at least some of the contact electrodes 261 and 262 may also be disposed between the first electrode 210 and the second electrode 220.

The light-emitting element 300 may have a shape extending in one direction or a direction and may be disposed such that the one direction or a direction is parallel to the direction in which the first electrode 210 and the second electrode 220 are spaced apart from each other. Since each of the contact electrodes 261 and 262 has a shape extending in the third direction DR3 crossing or intersecting the direction in which the electrodes 210 and 220 extend and the direction in which the electrodes 210 and 220 are spaced apart from each other, the contact electrodes 261 and 262 may cover or overlap one side or a side and the other side or another side of the light-emitting element 300, respectively, along the third direction DR3. For example, the contact electrodes 261 and 262 may be disposed to partially cover or overlap one end or an end and the other end or another end of the light-emitting elements 300, respectively, in one direction or a direction in which the light-emitting element 300 extends, and the one end or an end and the other end or another end may include regions that are not in contact with the contact electrodes 261 and 262. In an embodiment, some of both end surfaces of the light-emitting element 300 in one direction or a direction in which the light-emitting element 300 extends may be in contact with the contact electrodes 261 and 262. The contact electrodes 261 and 262 may be in contact with side surfaces of the light-emitting element 300 in another direction crossing or intersecting the one direction or a direction.

As described above, each of the first contact electrode 261 and the second contact electrode 262 may be disposed to correspond to the light-emitting element 300. The light-emitting elements 300 may be disposed between the first electrode 210 and the second electrode 220, and the contact electrodes 261 and 262 may be disposed to correspond to the light-emitting elements 300. According to one embodiment, first contact electrodes 261 and second contact electrodes 262 may be disposed respectively on the electrodes 210 and 220, and the first contact electrodes 261 and the second contact electrodes 262 may be disposed to be spaced apart from each other along the direction in which the electrodes 210 and 220 extend. For example, the first contact electrodes 261 and the second contact electrodes 262 may form patterns spaced apart from each other in one direction or a direction on the first electrode 210 and the second electrode 220, respectively. The arrangement of the contact electrodes 261 and 262, the light-emitting element 300, and the electrodes 210 and 220 will be described in detail below with reference to other drawings.

The outer bank 450 may be disposed at the boundary between the sub-pixels PXn. The outer bank 450 may be disposed to extend at least in the second direction DR2 to surround some of the electrodes 210 and 220 and the inner banks 410 and 420, including the region in which the light-emitting element 300 is disposed between the inner banks 410 and 420 and between the electrodes 210 and 220. The outer bank 450 may further include a portion extending in the first direction DR1, and may form a grid pattern on the entire surface of the display region DPA. However, the disclosure is not limited thereto, and, the outer bank 450 may be omitted.

Hereinafter, a stacked structure of the display device 10 will be described in detail with further reference to other drawings.

Figure 3:
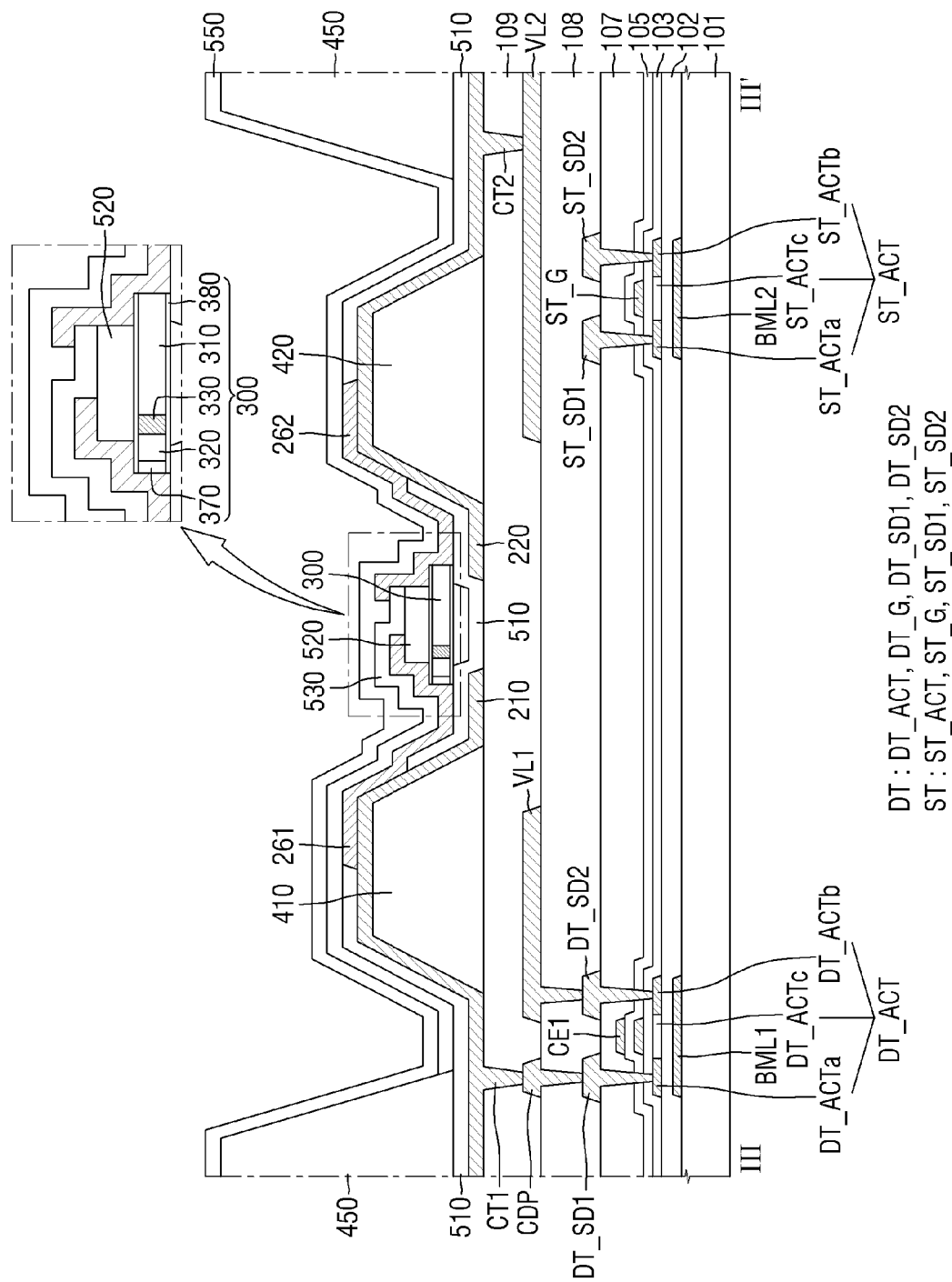
FIG. 3 is a schematic cross-sectional view taken along line III-III' of FIG. 2.

FIG. 3 is a schematic cross-sectional view taken along line III-III' of FIG. 2.

FIG. 3 illustrates a cross section of the first sub-pixel PX1 of FIG. 2, but the cross section may be identically applied to other pixels PX or sub-pixels PXn. FIG. 3 illustrates a cross section crossing or intersecting one end or an end and the other end or another end of the light-emitting element 300 disposed in the first sub-pixel PX1 of FIG. 2.

Referring to FIG. 3 in conjunction with FIG. 2, the display device 10 may include a circuit element layer and a display element layer disposed on a first substrate 101. A semiconductor layer, conductive layers, and insulating layers are disposed on the first substrate 101, each of which may constitute the circuit element layer and the display element layer. The conductive layers may include a first gate conductive layer, a second gate conductive layer, a first data conductive layer, and a second data conductive layer disposed below a first planarization layer 109 to form the circuit element layer, and electrodes 210 and 220 and contact electrodes 261 and 262 disposed on the first planarization layer 109 to form the display element layer. The insulating layers may include a buffer layer 102, a first gate insulating layer 103, a first protective layer 105, a first interlayer insulating layer 107, a second interlayer insulating layer 108, the first planarization layer 109, a first insulating layer 510, a second insulating layer 520, a third insulating layer 530, a fourth insulating layer 550, and the like within the spirit and the scope of the disclosure.

The circuit element layer may include circuit elements and lines for driving the light-emitting element 300, such as, a driving transistor DT, a switching transistor ST, a first conductive pattern CDP, and voltage lines VL1 and VL2, and the display element layer may include the light-emitting element 300 and include a first electrode 210, a second electrode 220, a first contact electrode 261, a second contact electrode 262, and the like within the spirit and the scope of the disclosure.

The first substrate 101 may be an insulating substrate. The first substrate 101 may be made of an insulating material such as glass, quartz, a polymer resin, or the like within the spirit and the scope of the disclosure. The first substrate 101 may be a rigid substrate but may also be a flexible substrate that may be bendable, foldable, rollable, or the like within the spirit and the scope of the disclosure.

Light-blocking layers BML1 and BML2 may be disposed on the first substrate 101. The light-blocking layers BML1 and BML2 may include a first light-blocking layer BML1 and a second light-blocking layer BM1L2. The first light-blocking layer BM1L1 and the second light-blocking layer BM1L2 are disposed to at least respectively overlap a first active material layer DT_ACT of the driving transistor DT and a second active material layer ST_ACT of the switching transistor ST. The light-blocking layers BM1L1 and BM1L2 may include light-blocking materials to prevent light from being incident on the first and second active material layers DT_ACT and ST_ACT. As an example, the first and second light-blocking layers BML1 and BML2 may be made of opaque metal materials that block light from being transmitted. However, the disclosure is not limited thereto, and, the light-blocking layers BML1 and BML2 may be omitted. Although not shown in the drawing, the first light-blocking layer BML1 may be electrically connected to a first source or drain electrode DT_SD1 of the driving transistor DT, which will be described below, and the second light-blocking layer BML2 may be electrically connected to a first source or drain electrode ST_SD1 of the switching transistor ST.

The buffer layer 102 may be entirely disposed on the first substrate 101, including the light-blocking layers BML1 and BML2. The buffer layer 102 may be formed on the first substrate 101 to protect the transistors DT and ST of the pixel PX from moisture permeating through the first substrate 101 that is vulnerable to moisture permeation, and may perform a surface planarization function. The buffer layer 102 may be formed as inorganic layers that may be alternately stacked each other. For example, the buffer layer 102 may be formed as multiple layers in which inorganic layers including at least one of silicon oxide ($SiO_x$), silicon nitride ($SiN_x$), and silicon oxynitride (SiON) may be alternately stacked each other.

The semiconductor layer is disposed on the buffer layer 102. The semiconductor layer may include the first active material layer DT_ACT of the driving transistor DT and the second active material layer ST_ACT of the switching transistor ST. The first active material layer DT_ACT and the second active material layer ST_ACT may be disposed to partially overlap gate electrodes DT_G and ST_G or the like of the first gate conductive layer to be described below.

In an embodiment, the semiconductor layer may include polycrystalline silicon, single-crystalline silicon, an oxide semiconductor, and the like within the spirit and the scope of the disclosure. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced lateral crystallization (MILC) method, and a sequential lateral solidification (SLS) method, and the like, but the disclosure is not limited thereto. In case that the semiconductor layer may include polycrystalline silicon, the first active material layer DT_ACT may include a first doped region DT_ACTa, a second doped region DT_ACTb, and a first channel region DT_ACTc. The first channel region DT_ACTc may be disposed between the first doped region DT_ACTa and the second doped region DT_ACTb. The second active material layer ST_ACT may include a third doped region ST_ACTa, a fourth doped region ST_ACTb, and a second channel region ST_ACTc. The second channel region ST_ACTc may be disposed between the third doped region ST_ACTa and the fourth doped region ST_ACTb. The first doped region DT_ACTa, the second doped region DT_ACTb, the third doped region ST_ACTa, and the fourth doped region ST_ACTb may be regions in which partial regions of each of the first active material layer DT_ACT and the second active material layer ST_ACT are doped with impurities.

In an embodiment, the first active material layer DT_ACT and the second active material layer ST_ACT may include an oxide semiconductor. The doped region of each of the first active material layer DT_ACT and the second active material layer ST_ACT may be a region that has become conductive. The oxide semiconductor may be an oxide semiconductor including indium (In). In an embodiment, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), or the like within the spirit and the scope of the disclosure. However, the disclosure is not limited thereto.

The first gate insulating layer 103 is disposed on the semiconductor layer and the buffer layer 102. The first gate insulating layer 103 may serve as gate insulating films of the driving transistor DT and the switching transistor ST. The first gate insulating layer 103 may be formed as a single inorganic layer including an inorganic material such as silicon oxide ($SiO_x$), silicon nitride ($SiN_x$), and silicon oxynitride ($SiO_xN_y$), or may be formed in a structure in which the inorganic layers may be alternately stacked each other or may be stacked each other in multiple layers.

The first gate conductive layer is disposed on the first gate insulating layer 103. The first gate conductive layer may include a first gate electrode DT_G of the driving transistor DT and a second gate electrode ST_G of the switching transistor ST. The first gate electrode DT_G is disposed to overlap at least a partial region of the first active material layer DT_ACT, and the second gate electrode ST_G is disposed to overlap at least a partial region of the second active material layer ST_ACT. For example, the first gate electrode DT_G may be disposed to overlap the first channel region DT_ACTc of the first active material layer DT_ACT in a thickness direction, and the second gate electrode ST_G may be disposed to overlap the second channel region ST_ACTc of the second active material layer ST_ACT in the thickness direction.

The first gate conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first protective layer 105 is disposed on the first gate conductive layer. The first protective layer 105 may be disposed to cover or overlap the first gate conductive layer and may perform a function of protecting the first gate conductive layer. The first protective layer 105 may be formed of a single inorganic layer including an inorganic material such as silicon oxide ($SiO_x$), silicon nitride ($SiN_x$), and silicon oxynitride ($SiO_xN_y$), or may be formed in a structure in which the inorganic layers may be alternately stacked each other or may be stacked each other in multiple layers.

The second gate conductive layer is disposed on the first protective layer 105. The second gate conductive layer may include a first capacitor electrode CE1 of a storage capacitor disposed so that at least a partial region thereof overlaps the first gate electrode DT_G in the thickness direction. The first capacitor electrode CE1 and the first gate electrode DT_G may overlap each other in the thickness direction with the first protective layer 105 interposed therebetween, and the storage capacitor may be formed therebetween. The second gate conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first interlayer insulating layer 107 is disposed on the second gate conductive layer. The first interlayer insulating layer 107 may serve as an insulating film between the second gate conductive layer and other layers disposed thereon. The first interlayer insulating layer 107 may be formed of a single inorganic layer including an inorganic material such as silicon oxide ($SiO_x$), silicon nitride ($SiN_x$), and silicon oxynitride ($SiO_xN_y$), or may be formed in a structure in which the inorganic layers may be alternately stacked each other or may be stacked each other in multiple layers.

The first data conductive layer is disposed on the first interlayer insulating layer 107. The first gate conductive layer may include the first source or drain electrode DT_SD1 and a second source or drain electrode DT_SD2 of the driving transistor DT, and the first source or drain electrode ST_SD1 and a second source or drain electrode ST_SD2 of the switching transistor ST.

The first source or drain electrode DT_SD1 and the second source or drain electrode DT_SD2 of the driving transistor DT may be respectively in contact with the first doped region DT_ACTa and the second doped region DT_ACTb of the first active material layer DT_ACT through contact holes passing through the first interlayer insulating layer 107 and the first gate insulating layer 103. The first source or drain electrode ST_SD1 and the second source or drain electrode ST_SD2 of the switching transistor ST may be respectively in contact with the third doped region ST_ACTa and the fourth doped region ST_ACTb of the second active material layer ST_ACT through contact holes passing through the first interlayer insulating layer 107 and the first gate insulating layer 103. The first source or drain electrode DT_SD1 of the driving transistor DT and the first source or drain electrode ST_SD1 of the switching transistor ST may be electrically connected to the first light-blocking layer BML1 and the second light-blocking layer BML2, respectively, through other contact holes. In the first source or drain electrodes DT_SD1 and ST_SD1 and the second source or drain electrodes DT_SD2 and ST_SD2 of the driving transistor DT and the switching transistor ST, in case that one electrode is a source electrode, the other electrode may be a drain electrode. However, the disclosure is not limited thereto, and in the first source or drain electrodes DT_SD1 and ST_SD1 and the second source or drain electrodes DT_SD2 and ST_SD2, in case that one electrode is a drain electrode, the other electrode may be a source electrode.

The first data conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The second interlayer insulating layer 108 may be disposed on the first data conductive layer. The second interlayer insulating layer 108 may be entirely disposed on the first interlayer insulating layer 107 while covering or overlapping the first data conductive layer and may sever to protect the first data conductive layer. The second interlayer insulating layer 108 may be formed of a single inorganic layer including an inorganic material such as silicon oxide ($SiO_x$), silicon nitride ($SiN_x$), and silicon oxynitride ($SiO_xN_y$), or may be formed in a structure in which the inorganic layers may be alternately stacked each other or may be stacked each other in multiple layers.

The second data conductive layer is disposed on the second interlayer insulating layer 108. The second data conductive layer may include a second voltage line VL2, a first voltage line VL1, and the first conductive pattern CDP. A high potential voltage (a first power voltage) to be supplied to the driving transistor DT may be applied to the first voltage line VL1, and a low potential voltage (a second power voltage) to be supplied to the second electrode 220 may be applied to the second voltage line VL2. During a manufacturing process of the display device 10, an alignment signal necessary to align the light-emitting element 300 may be applied to the second voltage line VL2.

The first conductive pattern CDP may be electrically connected to the first source or drain electrode DT_SD1 of the driving transistor DT through a contact hole formed in the second interlayer insulating layer 108. The first conductive pattern CDP may also be in contact with the first electrode 210, which will be described below, and the driving transistor DT may transmit the first power voltage applied from the first voltage line VL1 to the first electrode 210 through the first conductive pattern CDP. In the drawing, the second data conductive layer is illustrated as including one first voltage line VL1 and one second voltage line VL2, but the disclosure is not limited thereto. The second data conductive layer may include a larger number of first voltage lines VL1 and a larger number of second voltage lines VL2.

The second data conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first planarization layer 109 is disposed on the second data conductive layer. The first planarization layer 109 may include an organic insulating material, for example, an organic material such as polyimide (PI), and may perform a surface planarization function.

Inner banks 410 and 420, electrodes 210 and 220, an outer bank 450, contact electrodes 261 and 262, and the light-emitting element 300 are disposed on the first planarization layer 109. Further, insulating layers 510, 520, 530, and 550 may be further disposed on the first planarization layer 109.

The inner banks 410 and 420 are disposed on or directly disposed on the first planarization layer 109. The inner banks 410 and 420 may include a first inner bank 410 and a second inner bank 420 disposed adjacent to a center portion of each pixel PX or sub-pixel PXn.

Each of the first inner bank 410 and the second inner bank 420 may have a structure in which at least a portion thereof protrude with respect to an upper surface of the first planarization layer 109. The protruding portion of each of the first inner bank 410 and the second inner bank 420 may have inclined side surfaces, and light emitted from the light-emitting element 300 disposed between the first inner bank 410 and the second inner bank 420 may travel toward the inclined side surfaces of the inner banks 410 and 420. As will be described below, in case that the electrodes 210 and 220 respectively disposed on the inner banks 410 and 420 include a material having a high reflectance, the light emitted from the light-emitting element 300 may be reflected from the side surfaces of the inner banks 410 and 420 to be emitted in an upward direction with respect to the first substrate 101. For example, the inner banks 410 and 420 may provide a region in which the light-emitting element 300 is disposed and simultaneously may serve as a reflective partition wall that reflects the light emitted from the light-emitting element 300 upward. In an embodiment, the inner banks 410 and 420 may include an organic insulating material such as polyimide (PI), but the disclosure is not limited thereto.

The electrodes 210 and 220 are disposed on the inner banks 410 and 420 and the first planarization layer 109. The electrodes 210 and 220 may include the first electrode 210 disposed on the first inner bank 410 and the second electrode 220 disposed on the second inner bank 420.

The first electrode 210 and the second electrode 220 may be disposed on the first inner bank 410 and the second inner bank 420, respectively, and may be spaced apart from each other and face each other in the first direction DR1. The light-emitting elements 300 may be disposed between the first inner bank 410 and the second inner bank 420, and the light-emitting element 300 may be disposed between the first electrode 210 and the second electrode 220, and simultaneously, at least one end or an end of the light-emitting element 300 may be electrically connected to the first electrode 210 and the second electrode 220.

In an embodiment, the first electrode 210 and the second electrode 220 may be formed to have greater widths than the first inner bank 410 and the second inner bank 420, respectively. For example, the first electrode 210 and the second electrode 220 may be disposed to cover or overlap outer surfaces of the first inner bank 410 and the second inner bank 420, respectively. The first electrode 210 and the second electrode 220 may be disposed on side surfaces of the first inner bank 410 and the second inner bank 420, respectively, and a separation distance between the first electrode 210 and the second electrode 220 may be less than a separation distance between the first inner bank 410 and the second inner bank 420. At least a partial region of each of the first electrode 210 and the second electrode 220 may be disposed on or directly disposed on the first planarization layer 109.

The first electrode 210 may be electrically connected to the driving transistor DT. For example, the first electrode 210 may be in contact with the first conductive pattern CDP through a first contact hole CT1 formed in a region overlapping the outer bank 450 and passing through the first planarization layer 109, and through this, the first electrode 210 may be electrically connected to the first source or drain electrode DT_SD1 of the driving transistor DT.

The second electrode 220 may be electrically connected to the second voltage line VL2. For example, the second electrode 220 may be in contact with the second voltage line VL2 through a second contact hole CT2 formed in a region overlapping the outer bank 450 and passing through the first planarization layer 109. As shown in the drawing, the second electrodes 220 of the sub-pixels PXn adjacent in the first direction DR1 are electrically connected to the second voltage lines VL2 through the second contact holes CT2, respectively.

Each of the electrodes 210 and 220 may include a transparent conductive material. As an example, each of the electrodes 210 and 220 may include materials such as indium tin oxide (ITO), indium zinc oxide (IZO), indium tin-zinc oxide (ITZO), and the like, but the disclosure is not limited thereto. In an embodiment, each of the electrodes 210 and 220 may include a conductive material having a high reflectance. For example, each of the electrodes 210 and 220 may include a metal such as silver (Ag), copper (Cu), aluminum (Al), or the like as the material having a high reflectance. Each of the electrodes 210 and 220 may reflect light, which is emitted from the light-emitting element 300 and travels to the side surfaces of the first inner bank 410 and the second inner bank 420, in an upward direction with respect to each sub-pixel PXn.

The disclosure is not limited thereto, and each of the electrodes 210 and 220 may be formed in a structure, in which one or more layers of a transparent conductive material and a metal layer having a high reflectance may be stacked each other, or formed as a single layer including the transparent conductive material and the metal layer. In an embodiment, each of the electrodes 210 and 220 may have a stacked structure of ITO/Ag/ITO/IZO or may be an alloy including Al, Ni, lanthanum (La), and the like within the spirit and the scope of the disclosure.

The first insulating layer 510 is disposed on the first planarization layer 109, the first electrode 210, and the second electrode 220. The first insulating layer 510 may be disposed on a side opposite to the region between the inner banks 410 and 420 with respect to the inner banks 410 and 420 in addition to the region between the electrodes 210 and 220 or between the inner banks 410 and 420 being spaced apart from each other. The first insulating layer 510 is disposed to partially cover or overlap the first electrode 210 and the second electrode 220. For example, the first insulating layer 510 may be entirely disposed on the first planarization layer 109, including the first electrode 210 and the second electrode 220, and may be disposed to expose a portion of an upper surface of each of the first electrode 210 and the second electrode 220. An opening (not shown) partially exposing the first electrode 210 and the second electrode 220 may be formed in the first insulating layer 510, and the first insulating layer 510 may be disposed to cover or overlap only one side or a side and the other side or another side of each of the first electrode 210 and the second electrode 220. Some of portions of the first electrode 210 and the second electrode 220, which are disposed on the inner banks 410 and 420, may be exposed due to the opening.

The first insulating layer 510 may protect the first electrode 210 and the second electrode 220 and, simultaneously, insulate the first electrode 210 from the second electrode 220. The light-emitting element 300 disposed on the first insulating layer 510 may be prevented from being damaged by being in direct contact with other members. However, the shape and structure of the first insulating layer 510 are not limited thereto.

In an embodiment, a step difference may be formed on a portion of an upper surface of the first insulating layer 510 between the first electrode 210 and the second electrode 220. In an embodiment, the first insulating layer 510 may include an inorganic insulating material, and a portion of the upper surface of the first insulating layer 510 disposed to partially cover or overlap the first electrode 210 and the second electrode 220 may be stepped due to the step difference that is formed by the electrodes 210 and 220 disposed below the first insulating layer 510. Accordingly, an empty space may be formed between the light-emitting element 300, which is disposed on the first insulating layer 510 between the first electrode 210 and the second electrode 220, and the upper surface of the first insulating layer 510. The empty space may also be filled with a material forming the second insulating layer 520, which will be described below.

However, the disclosure is not limited thereto. The first insulating layer 510 may be formed such that a portion thereof disposed between the first electrode 210 and the second electrode 220 has a flat upper surface. The upper surface extends in one direction or a direction toward the first electrode 210 and the second electrode 220, and the first insulating layer 510 may also be disposed in regions in which the electrodes 210 and 220 overlap the inclined side surfaces of the first inner bank 410 and the second inner bank 420, respectively. The contact electrodes 261 and 262, which will be described below, may be in contact with the exposed regions of the first electrode 210 and the second electrode 220 and may be smoothly in contact with an end of the light-emitting element 300 on the flat upper surface of the first insulating layer 510.

The outer bank 450 may be disposed on the first insulating layer 510. As described above, the outer bank 450 may be disposed at the boundary between the sub-pixels PXn. According to one embodiment, a height of the outer bank 450 may be greater than a height of each of the inner banks 410 and 420. Unlike the inner banks 410 and 420, the outer bank 450 may divide adjacent sub-pixels PXn, and simultaneously, as will be described below, prevent the ink from overflowing to the adjacent sub-pixels PXn in the inkjet printing process for disposing the light-emitting element 300 during the manufacturing process of the display device 10. For example, the outer bank 450 may separate inks in which different light-emitting elements 300 are dispersed in different sub-pixels PXn from each other so as to prevent the inks from being mixed with each other. Like the inner banks 410 and 420, the outer bank 450 may include polyimide (PI), but the disclosure is not limited thereto.

The light-emitting element 300 may be disposed on the first insulating layer 510 between the inner banks 410 and 420 or between the electrodes 210 and 220. For example, the light-emitting element 300 may be disposed on the first insulating layer 510 disposed between the inner banks 410 and 420. At the same time, the light-emitting element 300 may be disposed such that a partial region thereof overlaps each of the electrodes 210 and 220 in the thickness direction. One end or an end of the light-emitting element 300 may overlap the first electrode 210 in the thickness direction and may be placed on the first electrode 210, and the other end thereof may overlap the second electrode 220 in the thickness direction and may be placed on the second electrode 220. However, the disclosure is not limited thereto, and although not shown in the drawing, at least some of the light-emitting elements 300 disposed in each sub-pixel PXn may be disposed in regions other than a region formed between the inner banks 410 and 420, for example, regions between the inner banks 410 and 420 and the outer bank 450.

The light-emitting element 300 may include layers disposed therein in a direction parallel to an upper surface of the first substrate 101 or the first planarization layer 109. The light-emitting element 300 of the display device 10 according to one embodiment may have a shape extending in one direction or a direction and have a structure in which semiconductor layers are sequentially disposed in the one direction or a direction. The light-emitting element 300 may be disposed such that the one direction or a direction, in which the light-emitting element 300 extends, is parallel to the first planarization layer 109, and semiconductor layers included in the light-emitting element 300 may be sequentially disposed in the direction parallel to the upper surface of the first planarization layer 109. However, the disclosure is not limited thereto. In case that the light-emitting element 300 has a different structure, the layers may be disposed in a direction perpendicular to the first planarization layer 109.

The second insulating layer 520 may be partially disposed on the light-emitting element 300 disposed between the first electrode 210 and the second electrode 220. For example, the second insulating layer 520 may be disposed on the first insulating layer 510 between the first electrode 210 and the second electrode 220, and the light-emitting element 300 may be disposed between the first insulating layer 510 and the second insulating layer 520. In an embodiment, in the light-emitting element 300, an insulating film 380 (see FIG. 4) formed on an outer surface of the light-emitting element 300 may be in direct contact with the first insulating layer 510 and the second insulating layer 520. For example, the second insulating layer 520 may be disposed to partially surround the outer surface of the light-emitting element 300 and thus may protect the light-emitting element 300, and simultaneously, may fix the light-emitting element 300 during the manufacturing process of the display device 10.

A portion of the second insulating layer 520 disposed on the light-emitting element 300 may have a shape extending in the second direction DR2 between the first electrode 210 and the second electrode 220 in a plan view. As an example, the second insulating layer 520 may form a stripe or island type pattern in each sub-pixel PXn.

The second insulating layer 520 may be disposed on the light-emitting element 300 and may expose one end or an end and the other end or another end of the light-emitting element 300. The exposed end of the light-emitting element 300 may be in contact with the contact electrodes 261 and 262, which will be described below. Such a shape of the second insulating layer 520 may be formed by a patterning process using a material forming the second insulating layer 520 by using a mask process. A mask for forming the second insulating layer 520 has a width less than a length of the light-emitting element 300, and the material forming the second insulating layer 520 may be patterned to expose both ends of the light-emitting element 300. However, the disclosure is not limited thereto.

Further, in an embodiment, a portion of the material of the second insulating layer 520 may be disposed between the first insulating layer 510 and a lower surface of the light-emitting element 300. The second insulating layer 520 may be formed to fill a space between the first insulating layer 510 and the light-emitting element 300, which is formed during the manufacturing process of the display device 10. Accordingly, the second insulating layer 520 may be formed to surround the outer surface of the light-emitting element 300. However, the disclosure is not limited thereto.

The contact electrodes 261 and 262 and the third insulating layer 530 may be disposed on the second insulating layer 520.

In an embodiment, the first contact electrode 261 and the second contact electrode 262 may be disposed to cover or overlap only some of the first electrode 210 and the second electrode 220, respectively. The first contact electrode 261 and the second contact electrode 262 may be disposed to be in contact with one side or a side and the other side or another side of the light-emitting element 300, respectively, and simultaneously, to cover or overlap only some of one side surfaces or side surfaces of the first electrode 210 and the second electrode 220, respectively. As described above, the upper surface of each of the first electrode 210 and the second electrode 220 may be partially exposed, and the first contact electrode 261 and the second contact electrode 262 may be in contact with the exposed upper surfaces of the first electrode 210 and the second electrode 220, respectively. For example, the first contact electrode 261 may be in contact with a portion of the first electrode 210, which is located or disposed on the first inner bank 410, and the second contact electrode 262 may be in contact with a portion of the second electrode 220, which is located or disposed on the second inner bank 420. However, the contact electrodes 261 and 262 may not be disposed on the other side surfaces of the first electrode 210 and the second electrode 220.

However, the disclosure is not limited thereto, and, the first contact electrode 261 and the second contact electrode 262 may each be formed to be greater in length in the extending direction, and may be disposed to partially cover or overlap both side surfaces of the first electrode 210 and the second electrode 220, respectively.

At least a partial region of each of the first contact electrode 261 and the second contact electrode 262 is disposed on the first insulating layer 510. According to one embodiment, the light-emitting element 300 has the semiconductor layer exposed on both end surfaces thereof in an extending direction, and the first contact electrode 261 and the second contact electrode 262 may be in contact with the light-emitting element 300 on the end surfaces where the semiconductor layer is exposed. However, as described above, the first contact electrode 261 and the second contact electrode 262 may be disposed to cover or overlap only some of the exposed both end surfaces of the light-emitting element 300, and another some of the both end surfaces may be exposed. However, the disclosure is not limited thereto.

The third insulating layer 530 is disposed on the first contact electrode 261. The third insulating layer 530 may electrically insulate the first contact electrode 261 and the second contact electrode 262 from each other. The third insulating layer 530 may be disposed to cover or overlap the first contact electrode 261 and may not be disposed on the other end of the light-emitting element 300 so that the light-emitting element 300 may be in contact with the second contact electrode 262. The third insulating layer 530 may be partially in contact with the first contact electrode 261 and the second insulating layer 520 at an upper surface of the second insulating layer 520. A side surface of the third insulating layer 530 in a direction in which the second electrode 220 is disposed may be aligned with one side surface or a side surface of the second insulating layer 520.

The second contact electrode 262 is disposed on the second electrode 220, the second insulating layer 520, and the third insulating layer 530. The second contact electrode 262 may be in contact with the other end or another end of the light-emitting element 300 and the exposed upper surface of the second electrode 220. The other end or another end of the light-emitting element 300 may be electrically connected to the second electrode 220 through the second contact electrode 262.

The first contact electrode 261 may be disposed between the first electrode 210 and the third insulating layer 530, and the second contact electrode 262 may be disposed on the third insulating layer 530. The second contact electrode 262 may be partially in contact with the second insulating layer 520, the third insulating layer 530, the second electrode 220, and the light-emitting element 300. One end or an end of the second contact electrode 262 in a direction in which the first electrode 210 is disposed may be disposed on the third insulating layer 530. The first contact electrode 261 and the second contact electrode 262 may not be in contact with each other due to the second insulating layer 520 and the third insulating layer 530. However, the disclosure is not limited thereto, and, the third insulating layer 530 may be omitted.

The contact electrodes 261 and 262 may include a conductive material. For example, the contact electrodes 261 and 262 may include ITO, IZO, ITZO, aluminum (Al), or the like within the spirit and the scope of the disclosure. As an example, the contact electrodes 261 and 262 may include a transparent conductive material, and light emitted from the light-emitting element 300 may pass through the contact electrodes 261 and 262 and travel toward the electrodes 210 and 220. Each of the electrodes 210 and 220 may include a material having a high reflectance, and the electrodes 210 and 220 disposed on the inclined side surfaces of the inner banks 410 and 420 may reflect incident light in an upward direction with respect to the first substrate 101. However, the disclosure is not limited thereto.

The fourth insulating layer 550 may be entirely disposed on the first substrate 101. The fourth insulating layer 550 may serve to protect members disposed on the first substrate 101 from an external environment.

Each of the first insulating layer 510, the second insulating layer 520, the third insulating layer 530, and the fourth insulating layer 550, which are described above, may include an inorganic insulating material or an organic insulating material. In an embodiment, the first insulating layer 510, the second insulating layer 520, the third insulating layer 530, and the fourth insulating layer 550 may each include an inorganic insulating material such as silicon oxide ($SiO_x$), silicon nitride ($SiN_x$), silicon oxynitride ($SiO_xN_y$), aluminum oxide ($Al_xO_y$), aluminum nitride ($Al_xN_y$), or the like within the spirit and the scope of the disclosure. As an example, the first insulating layer 510, the second insulating layer 520, the third insulating layer 530, and the fourth insulating layer 550 may each include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited thereto.

The light-emitting element 300 may be a light-emitting diode, and by way of example, may be an inorganic light-emitting diode having a size of a micrometer unit or a nanometer unit and made of an inorganic material. The inorganic light-emitting diode may be aligned between two electrodes in which polarity is formed by forming an electric field in a specific or selected direction between the two electrodes facing each other. The light-emitting element 300 may be aligned between the two electrodes due to the electric field formed on the two electrodes.

The light-emitting element 300 according to one embodiment may have a shape extending in one direction or a direction. The light-emitting element 300 may have a shape such as a rod, a wire, a tube, a plate, or the like within the spirit and the scope of the disclosure. In an embodiment, the light-emitting element 300 may have a hexahedral-shaped or plate-shaped structure. However, the shape of the light-emitting element 300 is not limited thereto, and the light-emitting element 300 may have one of various shapes including a shape of a regular hexahedron, a rectangular parallelepiped, a polygonal pillar such as a hexagonal pillar, a cylinder, or a rod or a shape that extends in one direction or a direction but has a partially inclined outer surface. Semiconductors included in the light-emitting element 300, which will be described below, may have a structure sequentially disposed or stacked each other in the one direction or a direction.

The light-emitting element 300 may include a semiconductor layer doped with an arbitrary conductive-type (for example, p-type or n-type) impurity. An electrical signal applied from an external power source may be transmitted to the semiconductor layer, and the semiconductor layer may emit light in a specific wavelength range.

Figure 4:
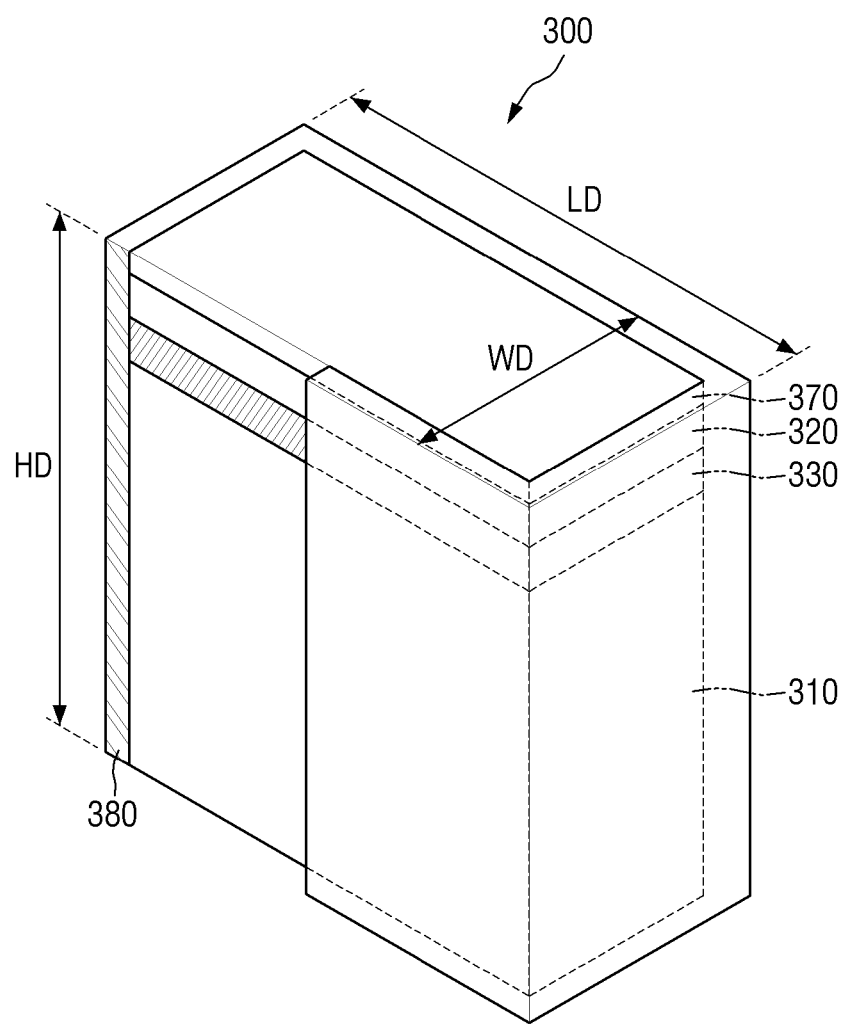
FIG. 4 is a schematic view of the light-emitting element according to one embodiment.

FIG. 4 is a schematic view of the light-emitting element according to one embodiment.

FIG. 4 illustrates a view in which the insulating film 380 of the light-emitting element 300 is partially cut to expose the semiconductor layers surrounded by the insulating film 380. However, the disclosure is not limited thereto, and the insulating film 380 may be disposed to surround at least a side surface of each of the semiconductor layers.

Referring to FIG. 4, the light-emitting element 300 may include a first semiconductor layer 310, a second semiconductor layer 320, the active layer 330, an electrode layer 370, and the insulating film 380.

The first semiconductor layer 310 may be an n-type semiconductor layer. As an example, in case that the light-emitting element 300 emits light in a blue wavelength range, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more among AlGaInN, GaN, AlGaN, InGaN, AlN, and InN that are doped with an n-type impurity. The first semiconductor layer 310 may be doped with an n-type dopant. As an example, the n-type dopant may be Si, Ge, Sn, or the like within the spirit and the scope of the disclosure. In an embodiment, the first semiconductor layer 310 may be n-GaN doped with n-type Si. A length of the first semiconductor layer 310 may range from about 1.5 μm to about 5 μm, but the disclosure is not limited thereto.

The second semiconductor layer 320 is disposed on the active layer 330 that will be described below. The second semiconductor layer 320 may be a p-type semiconductor. As an example, in case that the light-emitting element 300 emits light in a blue or green wavelength range, the second semiconductor layer 320 may include a semiconductor material having a chemical formula of AlxGayIn1-x-yN ($0<=x<=1$, $0<=y<=1$, and $0<=x+y<=1$). For example, the semiconductor material may be one or more among AlGaInN, GaN, AlGaN, InGaN, AlN, and InN that are doped with a p-type impurity. The second semiconductor layer 320 may be doped with a p-type dopant. As an example, the p-type dopant may be Mg, Zn, Ca, Se, Ba, or the like within the spirit and the scope of the disclosure. In an embodiment, the second semiconductor layer 320 may be p-GaN doped with p-type Mg. A length of the second semiconductor layer 320 may range from about 0.05 μm to about 0.10 μm, but the disclosure is not limited thereto.

Each of the first semiconductor layer 310 and the second semiconductor layer 320 is illustrated in the drawing as being formed as one layer or a layer, but the disclosure is not limited thereto. According to an embodiment, each of the first semiconductor layer 310 and the second semiconductor layer 320 may further include a larger number of layers, for example, a clad layer or a tensile strain barrier reducing (TSBR) layer according to a material of the active layer 330. A description thereof will be provided below with reference to other drawings.

The active layer 330 is disposed between the first semiconductor layer 310 and the second semiconductor layer 320. The active layer 330 may include a material having a single or multiple quantum well structure. In case that the active layer 330 may include a material having a multiple quantum well structure, the active layer 330 may have a structure in which quantum layers and well layers may be alternately stacked each other. The active layer 330 may emit light due to a combination of electron-hole pairs in response to electrical signals applied through the first semiconductor layer 310 and the second semiconductor layer 320. As an example, in case that the active layer 330 emits light in a blue wavelength range, the active layer 330 may include a material such as AlGaN, AlGaInN, or the like within the spirit and the scope of the disclosure. In case that the active layer 330 has a multiple quantum well structure in which quantum layers and well layers may be alternately stacked each other, the quantum layer may include a material such as AlGaN or AlGaInN, and the well layer may include a material such as GaN or AlInN. In an embodiment, the active layer 330 may include AlGaInN as a quantum layer and AlInN as a well layer. As described above, the active layer 330 may emit blue light having a central wavelength range ranging from about 450 nm to about 495 nm.

However, the disclosure is not limited thereto, and the active layer 330 may have a structure in which a semiconductor material having large bandgap energy and a semiconductor material having small bandgap energy may be alternately stacked each other or include other group III or group V semiconductor materials according to the wavelength range of emitted light. The light emitted by the active layer 330 is not limited to light in a blue wavelength range, and the active layer 330 may also emit light in a red or green wavelength range. A length of the active layer 330 may range from about 0.05 μm to about 0.10 μm, but the disclosure is not limited thereto.

The light emitted from the active layer 330 may be emitted to not only an outer surface of the light-emitting element 300 in a length direction but also both side surfaces of the light-emitting element 300. The directivity of the light emitted from the active layer 330 is not limited to one direction or a direction.

Figure 9:
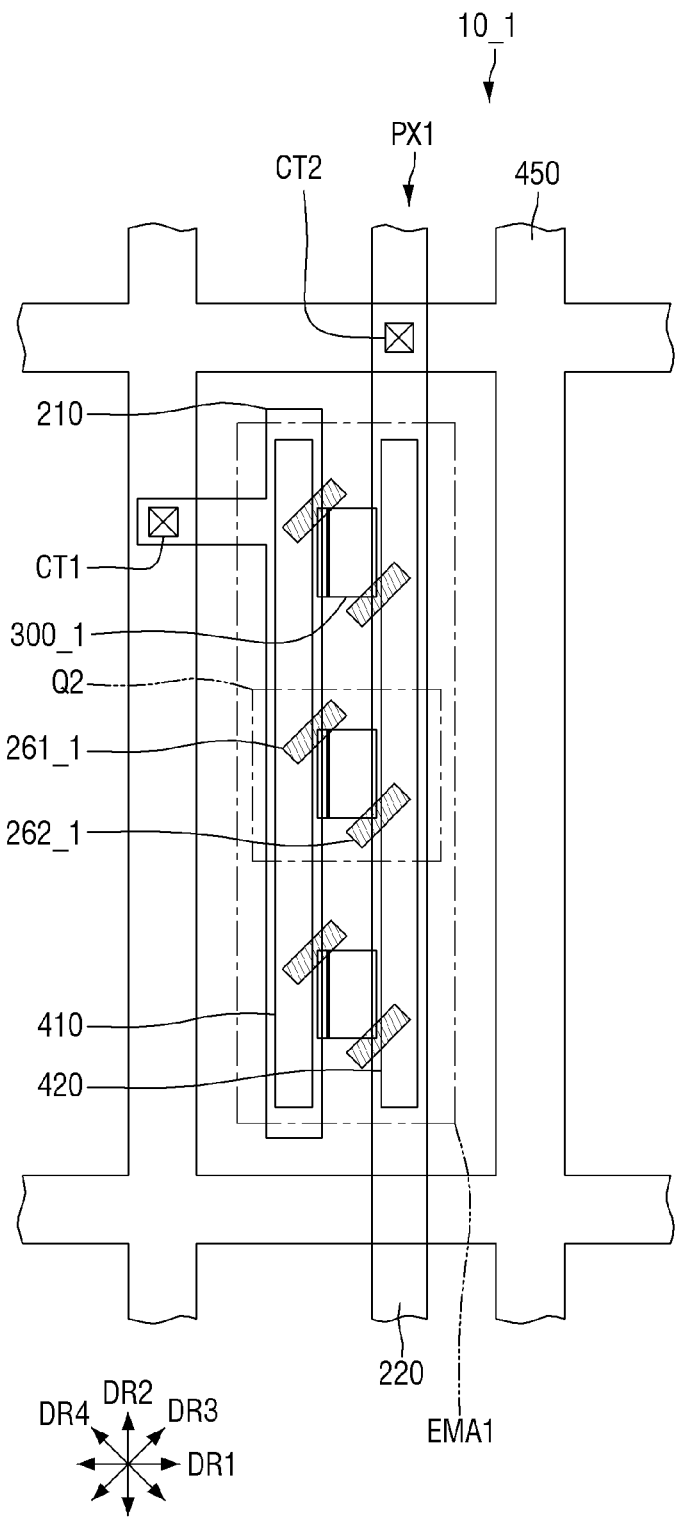
FIG. 9 is a schematic plan view illustrating one sub-pixel of a display device including the light-emitting element of FIG. 8.

The electrode layer 370 may be an ohmic contact electrode. However, the disclosure is not limited thereto, and the electrode layer 370 may also be a Schottky contact electrode. The light-emitting element 300 may include at least one electrode layer 370. Although the light-emitting element 300 is illustrated in FIG. 9 as including a single electrode layer 370, the disclosure is not limited thereto. The light-emitting element 300 may include a larger number of electrode layers 370, or the electrode layer 370 may be omitted. The description of the light-emitting element 300, which will be provided below, may be identically applied even in case that the number of the electrode layers 370 is varied or another structure is further included.

In case that the light-emitting element 300 is electrically connected to the electrodes 210 and 220 or the contact electrodes 261 and 262, the electrode layer 370 may reduce resistance between the light-emitting element 300 and the electrode or contact electrode. The electrode layer 370 may include a conductive metal. For example, the electrode layer 370 may include at least one among aluminum (Al), titanium (Ti), indium (In), gold (Au), silver (Ag), indium tin oxide (ITO), indium zinc oxide (IZO), and indium tin-zinc oxide (ITZO). Further, the electrode layer 370 may include a semiconductor material doped with an n-type or p-type impurity. However, the disclosure is not limited thereto.

The insulating film 380 is disposed to surround outer surfaces of the semiconductor layers and the electrode layers, which are described above. In an embodiment, the insulating film 380 may be disposed to surround at least an outer surface of the active layer 330 and may extend in one direction or a direction in which the light-emitting element 300 extends. The insulating film 380 may serve to protect the members. As an example, the insulating film 380 may be formed to surround side surface portions of the members and expose both ends of the light-emitting element 300 in the length direction.

In the drawing, the insulating film 380 is illustrated as being formed to extend in the length direction of the light-emitting element 300 to cover or overlap from the first semiconductor layer 310 to a side surface of the electrode layer 370, but the disclosure is not limited thereto. Since the insulating film 380 covers or overlaps only outer surfaces of some semiconductor layers, including the active layer 330 or covers or overlaps only a portion of the outer surface of the electrode layer 370, the outer surface of the electrode layer 370 may be partially exposed. An upper surface of the insulating film 380 may be formed to be rounded in cross section in a region adjacent to at least one end or an end of the light-emitting element 300.

A thickness of the insulating film 380 may range from about 10 nm to about 1.0 μm, but the disclosure is not limited thereto. As an example, the thickness of the insulating film 380 may be about 40 nm.

The insulating film 380 may include materials having insulating properties, for example, silicon oxide ($SiO_x$), silicon nitride ($SiN_x$), silicon oxynitride ($SiO_xN_y$), aluminum nitride ($Al_xN_y$), aluminum oxide ($Al_xO_y$), and the like within the spirit and the scope of the disclosure. Accordingly, it is possible to prevent an electrical short circuit which may occur in case that the active layer 330 is in direct contact with the electrode through which an electrical signal is transmitted to the light-emitting element 300. Further, since the insulating film 380 protects the outer surface of the light-emitting element 300, including the active layer 330, it is possible to prevent degradation in light-emitting efficiency.

Further, in an embodiment, an outer surface of the insulating film 380 may be surface treated. In case that the display device 10 is manufactured, the light-emitting element 300 may be sprayed on the electrodes in a state of being dispersed in an ink and aligned. Here, in order to maintain a state in which the light-emitting element 300 is dispersed in the ink without aggregating with another adjacent light-emitting element 300, the surface of the insulating film 380 may be hydrophobically or hydrophilically treated.

The light-emitting element 300 may have a height HD measured in a direction in which the semiconductor layers may be stacked each other. In an embodiment, the height HD of the light-emitting element 300 may range from about 1 μm to about 10 μm or from about 2 m to about 6 μm, and as an example, may range from about 3 μm to about 5 μm. In the light-emitting element 300 according to one embodiment, a width WD measured in one direction or a direction and a length LD measured in another direction perpendicular to the one direction or a direction may be defined. In an embodiment, the width WD of the light-emitting element 300 may range from about 300 nm to about 700 nm. However, the disclosure is not limited thereto, and the light-emitting elements 300 included in the display device 10 may have different diameters according to a composition difference of the active layer 330. As an example, the width WD of the light-emitting element 300 may be about 500 nm.

The length LD of the light-emitting element 300 may be greater than the width WD. The light-emitting element 300 may have a shape having the width WD measured in one direction or a direction greater than the length LD measured in another direction, in case that viewed from above. An area of the active layer 330 may vary depending on the width WD of the light-emitting element 300 measured in one direction or in a direction and the length LD thereof measured in another direction. According to one embodiment, the light-emitting element 300 may have the width WD in a specific or selected range and the length LD in a range, so that the area of the active layer 330 may be adjusted. Accordingly, in the light-emitting element 300, an amount of light emitted from the active layer 330 may be adjusted.

In the light-emitting element 300 according to one embodiment, as the length LD is adjusted, a ratio of the height HD and the length LD may vary. For example, in the light-emitting element 300, the length LD may be greater than the width WD and may be less than the height HD. However, the disclosure is not limited thereto, and in the light-emitting element 300, the length LD may be equal to the height HD, or the length LD may be greater than the height HD.

As described above, in case that the light-emitting element 300 is disposed between the first electrode 210 and the second electrode 220, the semiconductor layers may be disposed in a stacked form in a direction parallel to the upper surface of the first planarization layer 109. For example, in the light-emitting element 300, the semiconductor layers may be sequentially disposed along the first direction DR1 in which the first electrode 210 and the second electrode 220 are spaced apart from each other. As the light-emitting element 300 has such an arrangement, the direction in which the first electrode 210 and the second electrode 220 extend may be equal to the direction in which the length LD of the light-emitting element 300 extends.

Both ends of the light-emitting element 300, which is disposed between the electrodes 210 and 220, may be in contact with the first contact electrode 261 and the second contact electrode 262, respectively. In the display device 10 according to one embodiment, the contact electrodes 261 and 262 may each have a shape extending in a direction (for example, the third direction DR3) crossing or intersecting each of a direction (for example, the second direction DR2) in which the electrodes 210 and 220 extend and a direction (for example, the first direction DR1) in which the electrodes 210 and 220 are spaced apart from each other. For example, the contact electrodes 261 and 262 may extend in a direction crossing or intersecting the directions in which the height HD and the length LD of the light-emitting element 300 extend.

As the length LD of the light-emitting element 300 is adjusted in a range, the ratio of the height HD and the length LD of the light-emitting element 300 may vary. According to one embodiment, a first inclination angle formed between the extending direction of the first contact electrode 261 and the second contact electrode 262 and the extending direction of the electrodes 210 and 220 and a separation distance between the first contact electrode 261 and the second contact electrode 262 may be variously modified according to the length LD of the light-emitting element 300. In other words, the shape and arrangement of the first contact electrode 261 and the second contact electrode 262 of the display device 10 may vary according to the length LD of the light-emitting element 300. A more detailed description will be provided with further reference to other drawings.

Figure 5:
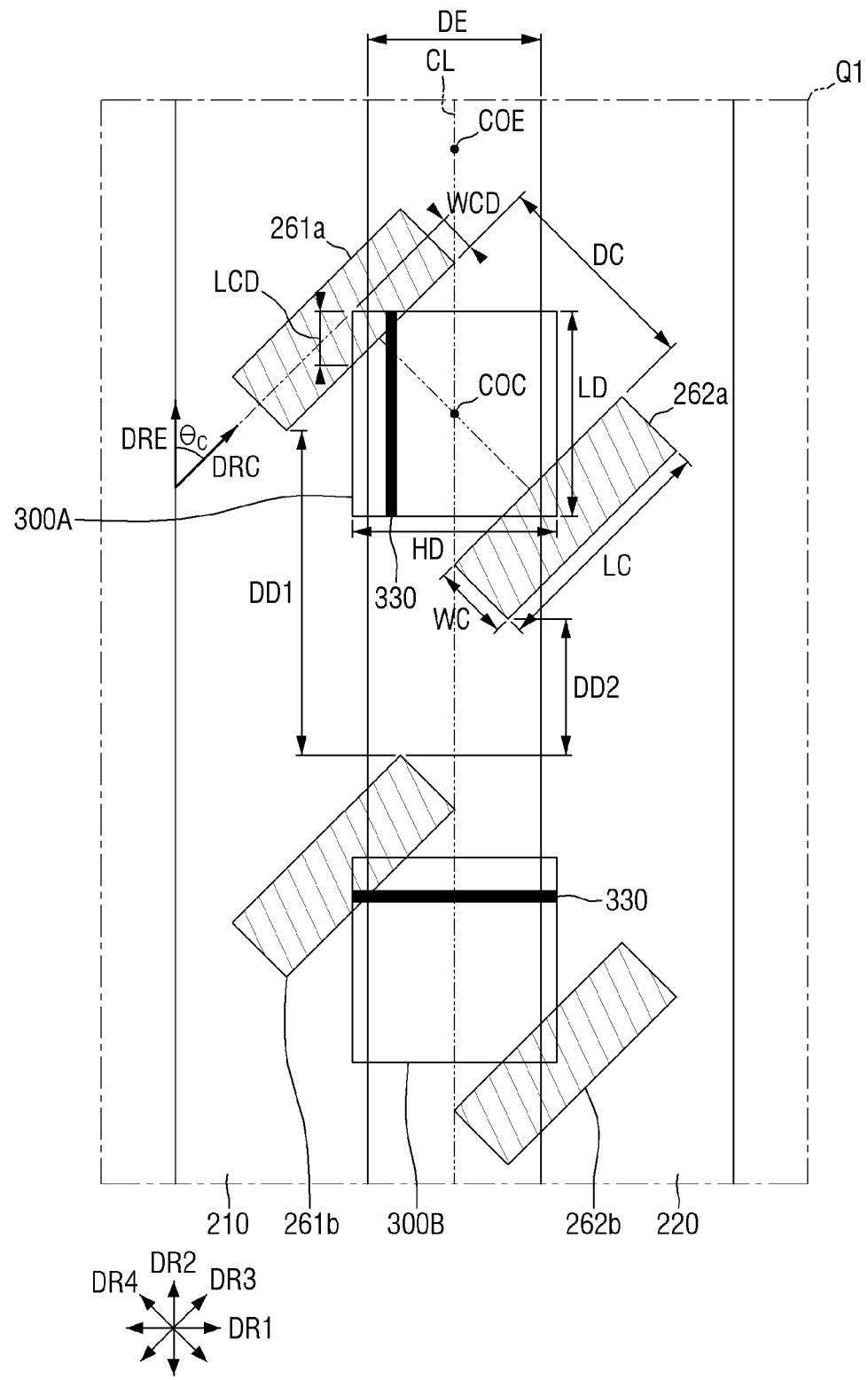
FIG. 5 is an enlarged view of portion Q1 of FIG. 2.

FIG. 5 is an enlarged view of portion Q1 of FIG. 2.

In FIG. 5, the light-emitting element 300 is illustrated as having a shape in which the height HD is equal to the length LD. However, the disclosure is not limited thereto, and according to an embodiment, the light-emitting element 300 may have the length LD less than or greater the height HD thereof.

Referring to FIG. 5, the display device 10 may include the first electrode 210 and the second electrode 220 disposed to extend in the second direction DR2 and to be spaced apart from each other in the first direction DR1, and the light-emitting elements 300 disposed between the first electrode 210 and the second electrode 220. The display device 10 may include the contact electrodes 261 and 262 that are in contact with the light-emitting element 300 and the first electrode 210 or the second electrode 220.

According to one embodiment, the light-emitting element 300 may have the height HD that is greater than a separation distance DE between the first electrode 210 and the second electrode 220. As described above, in the light-emitting element 300, the semiconductor layers may be stacked each other along a direction of the height HD, and the light-emitting element 300 may be disposed such that the direction in which the semiconductor layers may be stacked each other may be parallel to the first direction DR1, which is a direction in which the electrodes 210 and 220 are spaced apart from each other. The light-emitting element 300 may have the height HD that is greater than the separation distance DE between the electrodes 210 and 220, and one end or an end and the other end or another end of the light-emitting element 300 in the direction of the height HD may be placed on the first electrode 210 and the second electrode 220, respectively.

During the manufacturing process of the display device 10, the light-emitting elements 300 may be sprayed onto the electrodes 210 and 220 in a state of being dispersed in an ink and may be disposed between the electrodes 210 and 220 by an electric field generated on the electrodes 210 and 220. In case that the electric field is generated, the light-emitting elements 300 dispersed in the ink may receive a dielectrophoretic force by the electric field, and may be disposed between the electrodes 210 and 220 while changing locations and orientation directions thereof. Here, the dielectrophoretic force may be transmitted to the light-emitting element 300 so that a direction in which the first semiconductor layer 310, which is an n-type semiconductor layer, and the second semiconductor layer 320, which is a p-type semiconductor layer, may be stacked each other is directed in a direction parallel to a direction of the electric field. The electric field generated on the electrodes 210 and 220 may be generated to face the first direction DR1, which is a direction in which electrodes 210 and 220 are spaced apart from each other, and the light-emitting element 300 may be disposed such that the direction in which the semiconductor layers may be stacked each other is directed in the first direction DR1 in which the electrodes 210 and 220 are spaced apart from each other. However, the disclosure is not limited thereto, and at least some of the light-emitting elements 300 may be disposed such that the direction of the height HD is directed in another direction other than the first direction DR1.

For example, the light-emitting element 300 may have a shape in which the height HD is equal to the length LD, and at least some of the light-emitting elements 300 may be disposed such that the direction in which the semiconductor layers may be stacked each other is parallel to the second direction DR2. According to one embodiment, the light-emitting element 300 may include a first light-emitting element 300A in which the direction in which the semiconductor layers may be stacked each other is parallel to the direction (for example, the first direction DR1) in which the electrodes 210 and 220 are spaced apart from each other, and a second light-emitting element 300B in which the direction in which the semiconductor layers may be stacked each other may be parallel to the direction (for example, the second direction DR2) in which the electrodes 210 and 220 extend.

In the first light-emitting element 300A, a direction in which one surface or a surface of the active layer 330 faces may be the first direction DR1, and in the second light-emitting element 300B, the direction in which one surface or a surface of the active layer 330 faces may be the second direction DR2. However, the light-emitting element 300 may have a shape in which the height HD is equal to the length LD. The first light-emitting element 300A and the second light-emitting element 300B may be disposed such that one end or an end and the other end or another end of each of the first light-emitting element 300A and the second light-emitting element 300B in the first direction DR1 are disposed on the electrodes 210 and 220, respectively.

Both end surfaces of the light-emitting element 300 in the direction of the height HD may be exposed without forming the insulating film 380 thereon. The above-described contact electrodes 261 and 262 may be electrically connected to the light-emitting element 300 by being in contact with both end surfaces of the light-emitting element 300, respectively, in the direction of the height HD. For example, the first contact electrode 261 may be in contact with the electrode layer 370 of the light-emitting element 300, or the second semiconductor layer 320 of the light-emitting element 300 in case that the electrode layer 370 is omitted, and the second contact electrode 262 may be in contact with the first semiconductor layer 310 of the light-emitting element 300.

The light-emitting element 300 may have a same size in height HD and length LD, and may include the first light-emitting element 300A and the second light-emitting element 300B, in which the active layers 330 face different directions. The first light-emitting element 300A may be disposed such that the exposed both end surfaces face the first direction DR1, and the second light-emitting element 300B may be disposed such that the exposed both end surfaces face the second direction DR2. According to one embodiment, the contact electrodes 261 and 262 may each have a shape extending in one direction or a direction ("DRC" in FIG. 5, "DRC" in FIG. 6) crossing or intersecting the first direction DR1 and the second direction DR2 and may be disposed to partially cover or overlap both sides of the light-emitting element 300, respectively. Since the contact electrodes 261 and 262 extend in the one direction or a direction ("DRC" in FIG. 5), for example, in the third direction DR3, the contact electrodes 261 and 262 may be in contact with both end surfaces of the light-emitting element 300, respectively, in the direction of the height HD and in the direction of the length LD. The contact electrodes 261 and 262 may be in direct contact with the semiconductor layer of the light-emitting element 300, which is exposed in the direction of the height HD, regardless of the direction in which the active layer 330 of the light-emitting element 300 faces.

The first light-emitting element 300A may be disposed such the direction of the height HD is directed in the first direction DR1, and in both end surfaces of the first light-emitting element 300A in the first direction DR1, the semiconductor layers may be exposed. The first contact electrode 261 and the second contact electrode 262 may be in contact with both end surfaces of the first light-emitting element 300A in the first direction DR1, respectively, and both end surfaces of the first light-emitting element 300A in the second direction DR2, respectively, and may be in direct contact with the semiconductor layers exposed on both end surfaces of the first light-emitting element 300A in the first direction DR1. The second light-emitting element 300B may be disposed such the direction of the height HD is directed in the second direction DR2, and in both end surfaces of the second light-emitting element 300B in the second direction DR2, the semiconductor layers may be exposed. The first contact electrode 261 and the second contact electrode 262 may be in contact with both end surfaces of the second light-emitting element 300B in the first direction DR1, respectively, and both end surfaces of the second light-emitting element 300B in the second direction DR2, respectively, and may be in direct contact with the semiconductor layers exposed on both end surfaces of the second light-emitting element 300B in the second direction DR2.

For example, according to one embodiment, the light-emitting element 300 may include a first end surface and a second end surface in the first direction DR1, which is the direction of the height HD, and may include a third end surface and a fourth end surface in the second direction DR2, which is the direction of the length LD. The contact electrodes 261 and 262 may each have a shape extending in a direction DRC (see FIG. 5) crossing or intersecting the first direction DR1 and the second direction DR2, for example, in the third direction DR3, and may be in contact with each of the first to fourth end surfaces of the light-emitting element 300. The first contact electrode 261 may be in contact with the first end surface and the third end surface of the light-emitting element 300, and the second contact electrode 262 may be in contact with the second end surface and the fourth end surface. Here, the first end surface and the second end surface may each be an end surface on which the exposed semiconductor layer of the light-emitting element 300 is located or disposed.

As described above, the light-emitting element 300 may include the active layer 330 having an area of a desired level by having the width WD of a certain level and adjusting the length LD. As shown in FIG. 5, the light-emitting elements 300 may each have a same size in height HD and length LD, and may be disposed between the electrodes 210 and 220 in different directions without having a uniform orientation direction. Since the contact electrodes 261 and 262 according to one embodiment are disposed to have a shape extending in the direction DRC (see FIG. 5) diagonal to the light-emitting element 300 disposed between the electrodes 210 and 220, the contact electrodes 261 and 262 may be in electrical contact with each of the light-emitting elements 300 regardless of the orientation direction of the light-emitting element 300.

The contact electrodes 261 and 262 may not be directly connected to each other and may be electrically connected to the different electrodes 210 and 220, respectively, so that different signals may be transmitted thereto. The first contact electrode 261 and the second contact electrode 262 may be disposed to be spaced apart from each other by a separation distance DC (see FIG. 5) and to partially cover or overlap both sides of the light-emitting element 300. The contact electrodes 261 and 262 may be in contact with the light-emitting element 300 in a direction diagonal to the direction of the height HD or length LD with a first inclination angle θc. Since the contact electrodes 261 and 262 are disposed to be spaced apart from each other in the diagonal direction, there is a process advantage in that a sufficient separation distance DC between the contact electrodes 261 and 262 may be secured even in case that the light-emitting element 300 has a relatively small height HD and length LD.

For example, the contact electrodes 261 and 262 are not in contact with the entire exposed semiconductor layer of the light-emitting element 300, but are in contact with only a partial region of the semiconductor layer while covering or overlapping the light-emitting element 300 by a contact distance WCD (see FIG. 5) from one side or a side of the light-emitting element 300 in the diagonal direction. The contact distance WCD may be defined as a vertical distance of a region of the light-emitting element 300 covered or overlapped by the contact electrode 261 or 262 from one side or a side of the light-emitting element 300 in the diagonal direction. At the same time, the exposed semiconductor layer of the light-emitting element 300 may have a contact area LCD (see FIG. 5) in contact with the contact electrode 261 or 262. Electrical signals transmitted through the electrodes 210 and 220 may be transmitted through regions in which the contact electrodes 261 and 262 are in contact with the semiconductor layers of the light-emitting element 300. In case that the contact area LCD of the light-emitting element 300 and the contact electrode 261 or 262 satisfies a certain level or more, the electrical signals may be spread across the entirety of the light-emitting element 300 even in case that partial regions of the semiconductor layers are in contact with the contact electrodes 261 and 262.

According to one embodiment, even in case that the contact electrodes 261 and 262 are each disposed to cover or overlap the light-emitting element 300 by the contact distance WCD by being inclined with respect to the contact area LCD, the required contact area LCD may be secured. For example, in the display device 10 according to one embodiment, the contact electrodes 261 and 262 may each have a shape extending in the direction DRC (see FIG. 5) crossing or intersecting an extending direction DRE (see FIG. 5) of the electrodes 210 and 220 to form the first inclination angle θc (see FIG. 5) with the direction DRE (see FIG. 5) in which the electrodes 210 and 220 extend, and thus there may be a process advantage in adjusting the separation distance DC between the contact electrodes 261 and 262. A more detailed description thereof will be provided below.

As described above, the contact electrodes 261 and 262 may be disposed to correspond to the respective light-emitting elements 300, and patterns in which the contact electrodes 261 and 262 are disposed to be spaced apart from each other may be formed in each sub-pixel PXn. For example, the first contact electrode 261 may include a first pattern 261a in contact with one side or a side of the first light-emitting element 300A and a second pattern 261b in contact with one side or a side of the second light-emitting element 300B. The second contact electrode 262 may include a third pattern 262a in contact with the other side or another side of the first light-emitting element 300A and a fourth pattern 262b in contact with the other side or another side of the second light-emitting element 300B. The first pattern 261a and the second pattern 261b may be disposed to be spaced apart from each other in the direction in which the first electrode 210 extends, and the third pattern 262a and the fourth pattern 262b may be disposed to be spaced apart from each other in the direction in which the second electrode 220 extends.

A first pattern gap DD1 by which the first pattern 261a and the second pattern 261b of the first contact electrode 261 are spaced apart from each other and a second pattern gap DD2 by which the second pattern 261b of the first contact electrode 261 and the third pattern 262a of the second contact electrode 262 are spaced apart from each other may be variously modified according to a size of the light-emitting element 300, a separation distance between the light-emitting elements 300, and a length LC and a width WC of each of the contact electrodes 261 and 262.

For example, the first pattern gap DD1 by which the first pattern 261a and the second pattern 261b are spaced apart from each other may be greater than at least the length LD of the light-emitting element 300 so that the first pattern 261a and the second pattern 261b may be in contact with the different light-emitting elements 300, respectively. However, the disclosure is not limited thereto. The first pattern gap DD1 may be less than the length LD of the light-emitting element 300, and first contact electrodes 261 may be in contact with one light-emitting element 300. However, as an example, one first contact electrode 261 or one second contact electrode 262 may be disposed in one light-emitting element 300.

Further, in the contact electrodes 261 and 262, since the extending direction DRC is not parallel to the extending direction DRE (see FIG. 5) of the electrodes 210 and 220, the length LC and the second pattern gap DD2 may have the length LC to the extent that each of the contact electrodes 261 and 262 do not come into contact with one pattern of each of other contact electrodes 261 and 262. For example, the length LC of each of the contact electrodes 261 and 262 may have a range that can be spaced apart from the second electrode 220 even in case that the first pattern 261a extends in one direction DRC or a direction on the first electrode 210. At the same time, the second pattern 261b and the third pattern 262a may each have the length LC and the second pattern gap DD2 to the extent that the second pattern 261b and the third pattern 262a are not in contact with each other. The second pattern gap DD2 may vary depending on an average interval of the light-emitting elements 300 disposed between the first electrode 210 and the second electrode 220.

The width WC of each of the contact electrodes 261 and 262 may vary depending on the contact area LCD in addition to the separation distance DC between the first contact electrode 261 and the second contact electrode 262 and the first inclination angle θc. The width WC of each of the contact electrodes 261 and 262 may be adjusted in consideration of the contact area LCD in case that the first inclination angle θc and the separation distance DC are determined according to process conditions of forming the contact electrodes 261 and 262.

As described above, the separation distance DC between the contact electrodes 261 and 262 and the first inclination angle θc formed by the contact electrodes 261 and 262 and the electrodes 210 and 220 may be variously modified according to the height HD and the length LD of the light-emitting element 300. This will be described below with further reference to other drawings.

Figure 6:
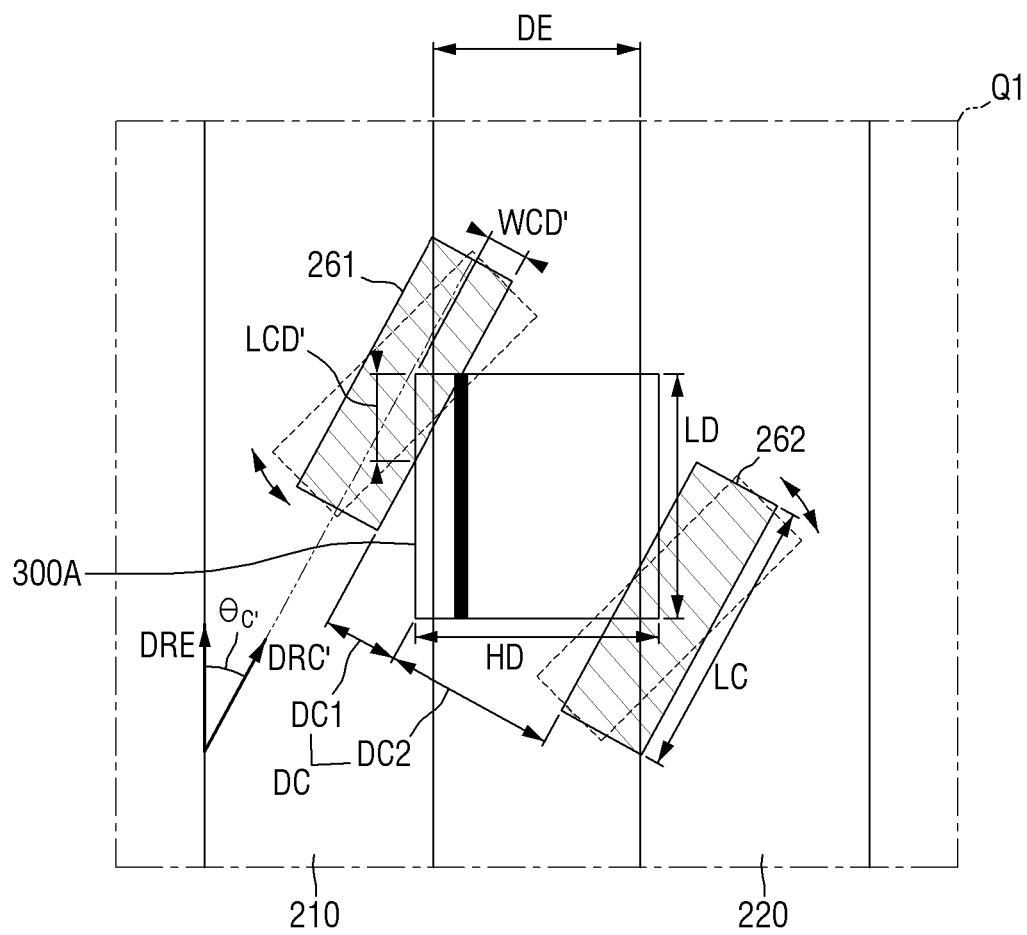
FIG. 6 is a schematic plan view illustrating an arrangement of the light-emitting element and a contact electrode connected to the light-emitting element according to one embodiment.
Figure 7:
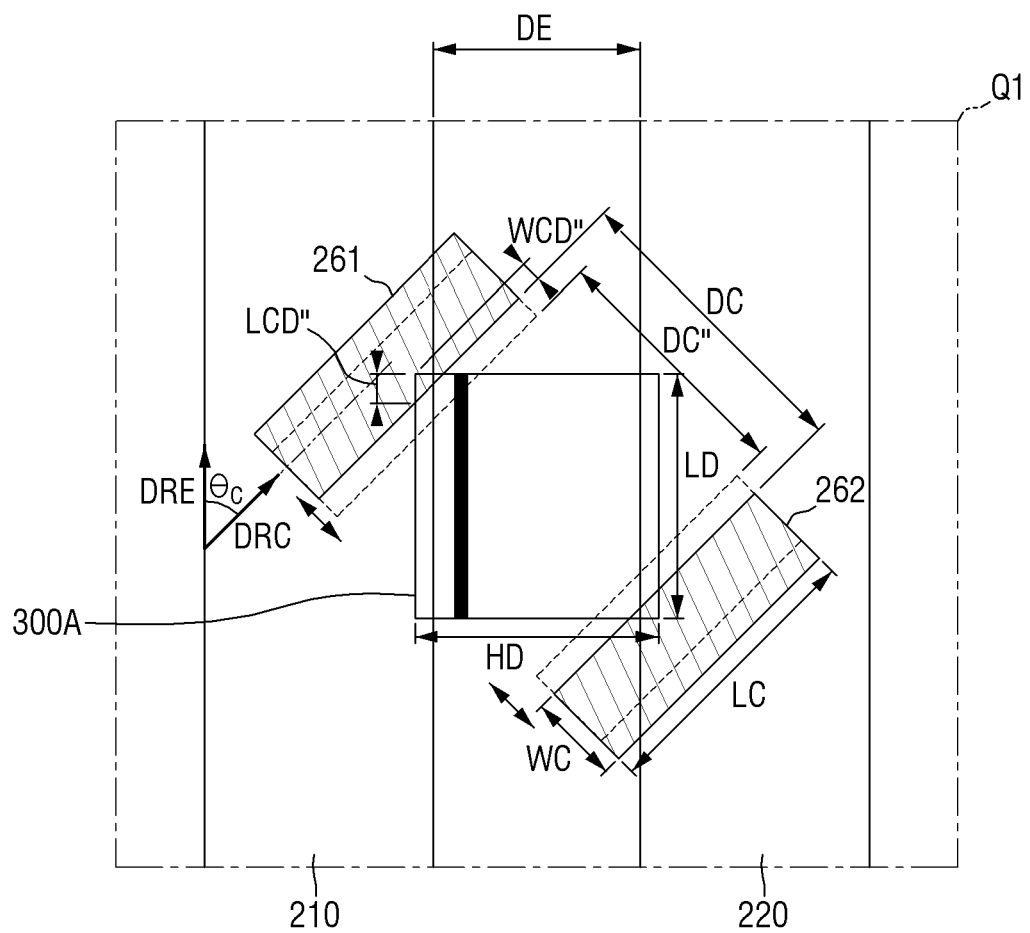
FIG. 7 is a schematic plan view illustrating an arrangement of the light-emitting element and the contact electrode connected to the light-emitting element according to one embodiment.

FIG. 6 is a schematic plan view illustrating an arrangement of the light-emitting element and a contact electrode connected to the light-emitting element according to one embodiment. FIG. 7 is a schematic plan view illustrating an arrangement of the light-emitting element and the contact electrode connected to the light-emitting element according to one embodiment.

Referring to FIGS. 6 and 7 in addition to FIG. 5, in the contact electrodes 261 and 262 according to one embodiment, the separation distance DC between the contact electrodes 261 and 262 and the first inclination angle θc formed with the extending direction DRE of the electrodes 210 and 220 may vary according to the height HD and the length LD of the light-emitting element 300.

As an example, the first contact electrode 261 and the second contact electrode 262 may be disposed to be spaced apart from each other in a direction perpendicular to the extending direction DRC of the contact electrodes 261 and 262, and may be disposed such that a midpoint COC (see FIG. 5) of the separation distance between the contact electrodes 261 and 262 is placed on a same line CL (see FIG. 5) as a midpoint COE (see FIG. 5) of the separation distance between the electrodes 210 and 220. A midpoint of the height HD of the light-emitting element 300 may also be disposed to be placed on a same line CL as the midpoints COC and COE.

As described above, the contact electrodes 261 and 262 may be disposed to have the contact area LCD of a certain level or more with the light-emitting element 300. The contact area LCD may be an area in which the contact electrode 261 or 262 is in contact with one surface or a surface of the exposed semiconductor layer of the light-emitting element 300, and may be a minimum area required for an electrical signal to be smoothly transmitted to the light-emitting element 300 through the contact electrode 261 or 262. For example, the contact electrodes 261 and 262 may be disposed to have the minimum contact area LCD while having the first inclination angle θc with respect to the direction of the height HD or length LD of the light-emitting element 300.

Here, in case that the contact electrodes 261 and 262 are disposed with the first inclination angle θc formed by the extending direction DRC of the contact electrodes 261 and 262 and the extending direction DRE of the electrodes 210 and 220, sides of the light-emitting element 300, which are spaced apart from each other and face each other due to the contact electrodes 261 and 262 and the contact area LCD, may be disposed to have the first inclination angle θc. In case that the light-emitting element 300 is disposed such that the separation distance between the electrodes 210 and 220 is parallel to the direction of the height HD, in an embodiment, the first inclination angle θc of the contact electrodes 261 and 262, the separation distance DC between the contact electrodes 261 and 262, and the height HD and the length LD of the light-emitting element 300 may have a relationship of Equation 1 below, $$DC = LD \sin θc + HD \cos θc - 2LCD \sin θc \quad \text{[Equation 1]}$$

where, "DC" refers to a separation distance between the first contact electrode 261 and the second contact electrode 262, "LD" refers to a length of the light-emitting element 300, "HD" refers to a height of the light-emitting element 300, "LCD" refers to a length of a contact area between the light-emitting element 300 and the contact electrode 261 or 262, and "θc" refers to a first inclination angle between an extending direction of the contact electrodes 261 and 262 and an extending direction of the electrodes 210 and 220.

In case that it is possible to design such that the contact electrodes 261 and 262 are disposed to correspond to the light-emitting element 300 during the manufacturing process of the display device 10, the first inclination angle θc and the separation distance DC of the contact electrodes 261 and 262 may be adjusted through Equation 1 in case that the height HD and the length LD of the light-emitting element 300 and the required contact area LCD are specified.

For example, as shown in FIG. 6, in case that the height HD and the length LD of the light-emitting element 300 and a contact area LCD' in which the light-emitting element 300 is in contact with the contact electrode 261 or 262 are determined, the separation distance DC between the contact electrodes 261 and 262 may be fixed to adjust a first inclination angle θc' between the contact electrodes 261 and 262 and the electrodes 210 and 220. The separation distance DC between the contact electrodes 261 and 262 may be defined as the sum of a separation distance DC1 (see FIG. 6) between one side surface or a side surface of the light-emitting element 300 and an extending line of one side or a side of the first contact electrode 261 and a separation distance DC2 (see FIG. 6) between an extending line of one side or a side of the second contact electrode 262 and the one side surface or a side surface of the light-emitting element 300. In case that the separation distance DC between the contact electrodes 261 and 262 is determined based on Equation 1, the first inclination angle θc between the contact electrodes 261 and 262 and the electrodes 210 and 220 may be determined according to the required contact area LCD. In an embodiment, the first inclination angle θc of the contact electrodes 261 and 262 may have a value between about 100 and about 800 or between about 300 and about 60°, and as an example about 450 according to the length LD of the light-emitting element 300. However, the disclosure is not limited thereto.

In case that the first inclination angle θc and the separation distance DC of the contact electrodes 261 and 262 are determined, the length LC and the width WC of the contact electrodes 261 and 262 may be adjusted. The contact electrodes 261 and 262 may have the required width WC and length LC so that the contact electrodes 261 and 262 are disposed to be spaced apart from each other by the separation distance DC and in contact with both sides of the light-emitting element 300 to have the contact area LCD of a certain level or more. In an embodiment, in the contact electrodes 261 and 262, the width WC may be greater than at least the contact distance WCD. The contact distance WCD' may have a value obtained by dividing the length of the contact area LCD by "sin θc," and in the contact electrodes 261 and 262, the width WC may be greater than the contact distance WCD'. The length LC of each of the contact electrodes 261 and 262 may have a length to the extent of partially covering or overlapping an end surface of the light-emitting element 300 perpendicular to the contact area LCD, including at least the contact area LCD. For example, the length LC of each of the contact electrodes 261 and 262 may be greater than at least a value obtained by dividing the length of the contact area LCD by "cos θc."

Further, as shown in FIG. 7, the first inclination angle θc of the contact electrodes 261 and 262 may be fixed and the separation distance DC between the contact electrodes 261 and 262 may be adjusted. In case that the height HD and the length LD of the light-emitting element 300 and a contact area LCD" in which the light-emitting element 300 is in contact with the contact electrode 261 or 262 are determined, the first inclination angle θc between the contact electrodes 261 and 262 and the electrodes 210 and 220 may be fixed to adjust a separation distance DC" between the contact electrodes 261 and 262. In case that the width WC and the length LC of the contact electrodes 261 and 262 are determined, and the first inclination angle θc between the contact electrodes 261 and 262 and the electrodes 210 and 220 is determined, the separation distance DC" between the contact electrodes 261 and 262 may be adjusted according to the required contact area LCD" based on Equation 1. The contact distance of the portion of one side or a side of the light-emitting element 300 covered or overlapped by the contact electrode 261 or 262 may be changed to a contact distance WCD".

However, in an embodiment, the separation distance between the contact electrodes 261 and 262 may have a value that is less than a value determined through Equation 1 above. In consideration of a process tolerance in a process of forming the contact electrodes 261 and 262, the contact electrodes 261 and 262 may be formed with a separation distance less than the separation distance DC determined through Equation 1. For example, the contact electrodes 261 and 262 according to one embodiment may satisfy Equation 2 bellow, $$DC \leq LD \sin \theta c + HD \cos \theta c - 2LCD \sin \theta c \quad \text{[Equation 2]}$$

where, "DC," "LD," "HD," "LCD," and "θc" are the same as described above.

The contact electrodes 261 and 262 may be disposed to have various separation distances DC and first inclination angles θc according to a process design within a range satisfying Equation 2. In the display device 10 according to one embodiment, since the contact electrodes 261 and 262 are disposed to be spaced apart from each other with the first inclination angle θc with respect to the electrodes 210 and 220, there is a process advantage of securing a sufficient separation distance DC between the contact electrodes 261 and 262 even in case that the light-emitting element 300 has a relatively small height HD and length LD.

The first inclination angle θc and the separation distance DC of the contact electrodes 261 and 262 may be variously modified in a same manner even in case that the light-emitting element 300 has a different shape.

Figure 8:
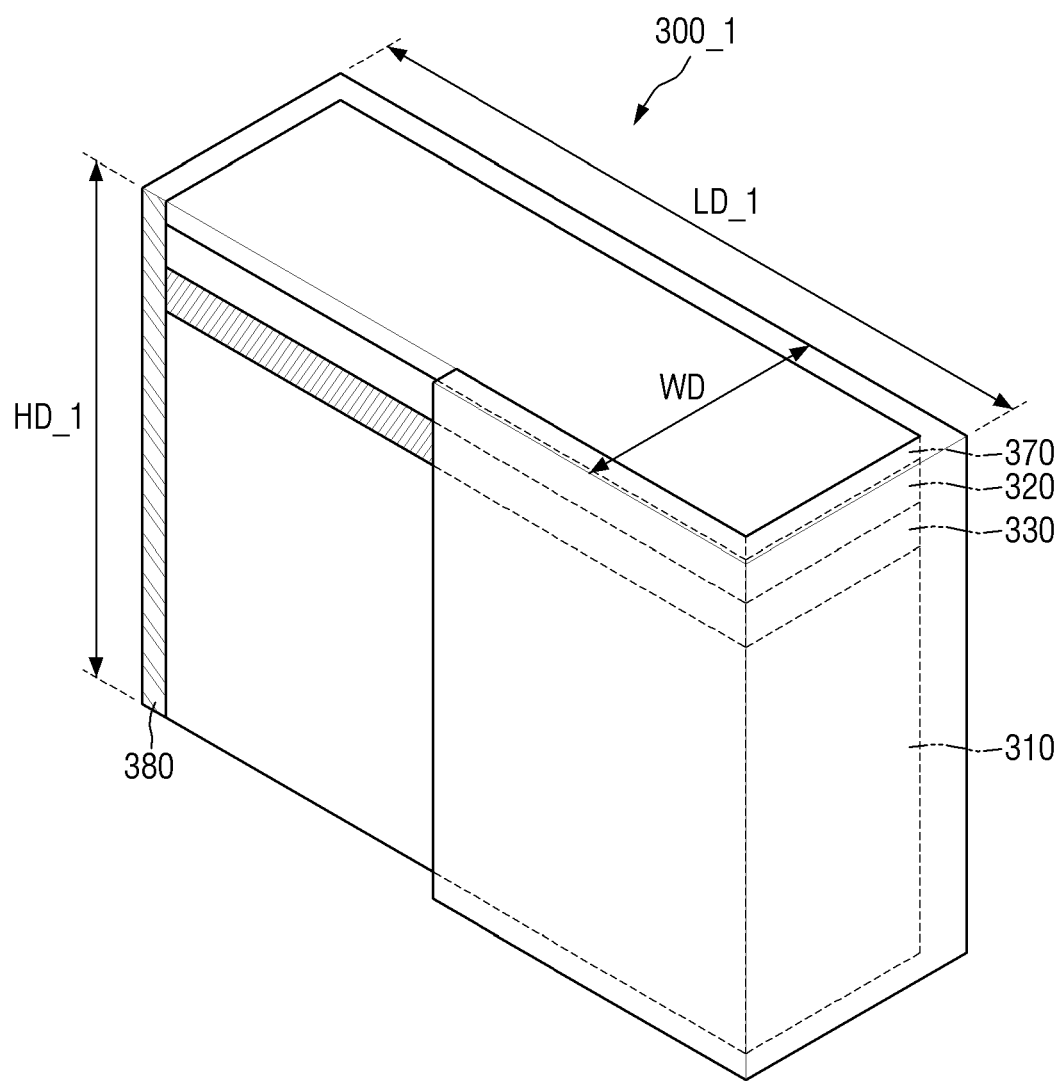
FIG. 8 is a schematic view of a light-emitting element according to an embodiment.
Figure 10:
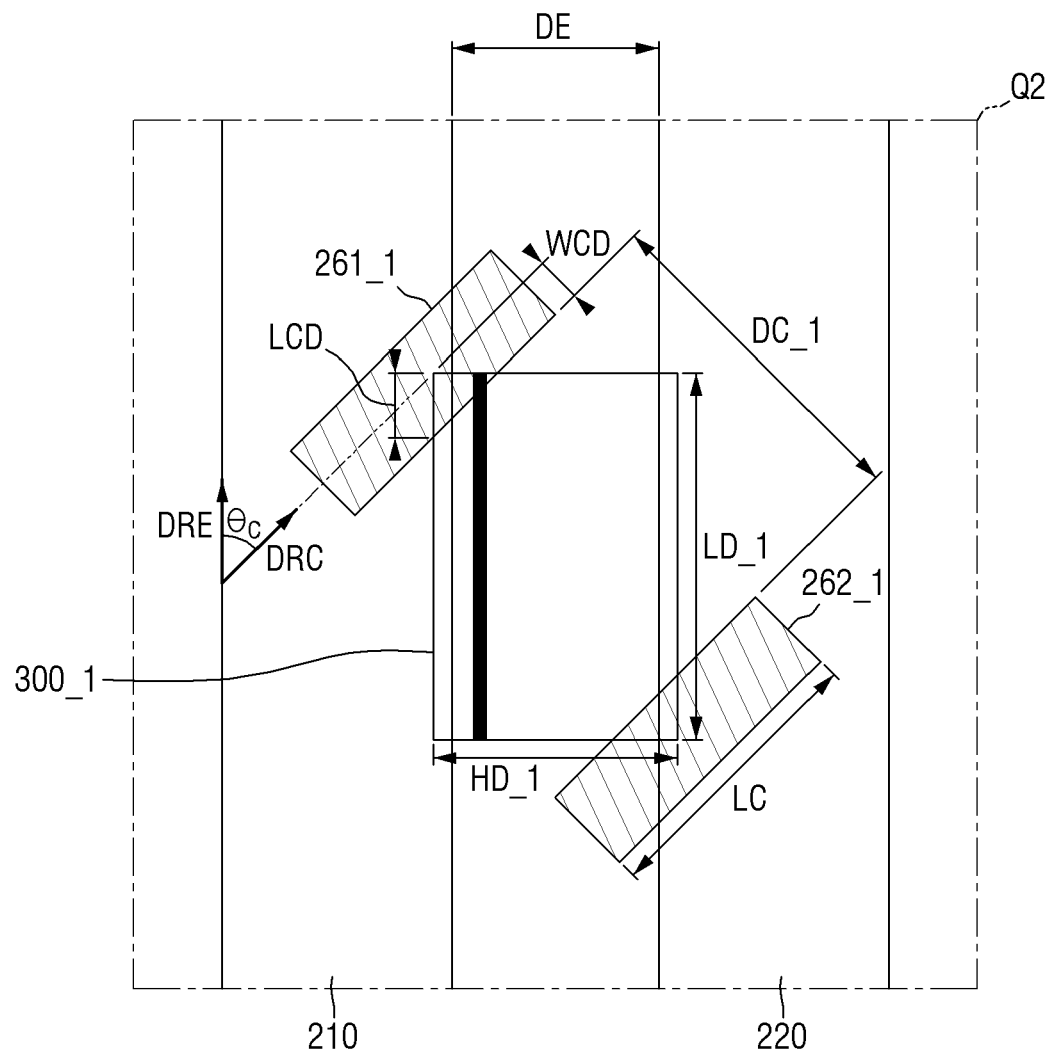
FIG. 10 is an enlarged view of portion Q2 of FIG. 9.
Figure 10:
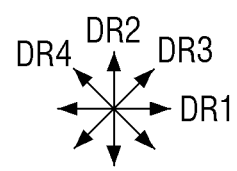

FIG. 8 is a schematic view of a light-emitting element according to an embodiment. FIG. 9 is a schematic plan view illustrating one sub-pixel of a display device including the light-emitting element of FIG. 8. FIG. 10 is an enlarged view of portion Q2 of FIG. 9.

Referring to FIG. 8, a light-emitting element 300_1 according to one embodiment may have a length LD_1 greater than a height HD_1 thereof. Accordingly, in the light-emitting element 300_1, an active layer 330 may have a larger area, and an amount of light emitted by one light-emitting element 300_1 may be further increased.

Referring to FIGS. 9 and 10, a display device 10_1 according to one embodiment may include the light-emitting element 300_1 having the height HD_1 less than the length LD_1. Since the light-emitting element 300_1 may include the active layer 330 having a larger area, the number of light-emitting elements 300_1 disposed in each sub-pixel PXn may be reduced.

Further, in a first contact electrode 261_1 and a second contact electrode 262_1 of the display device 10_1, a separation distance DC_1 between the first contact electrode 261_1 and the second contact electrode 262_1 and a slope or a first inclination angle θc formed by the first contact electrode 261_1 or the second contact electrode 262_1 and each of electrodes 210 and 220 may vary. In case that compared with FIGS. 5 to 7, the first contact electrode 261_1 and the second contact electrode 262_1 may be disposed to be spaced apart from each other with a larger separation distance DC_1. In the light-emitting element 300_1, since the length LD_1 is increased, a sufficient contact area LCD may be secured even in case that the contact electrodes 261_1 and 262_1 are spaced apart from each other with a relatively large separation distance DC_1.

However, the disclosure is not limited thereto. In an embodiment, the light-emitting element 300 may have the length LD less than the height HD thereof.

Figure 11:
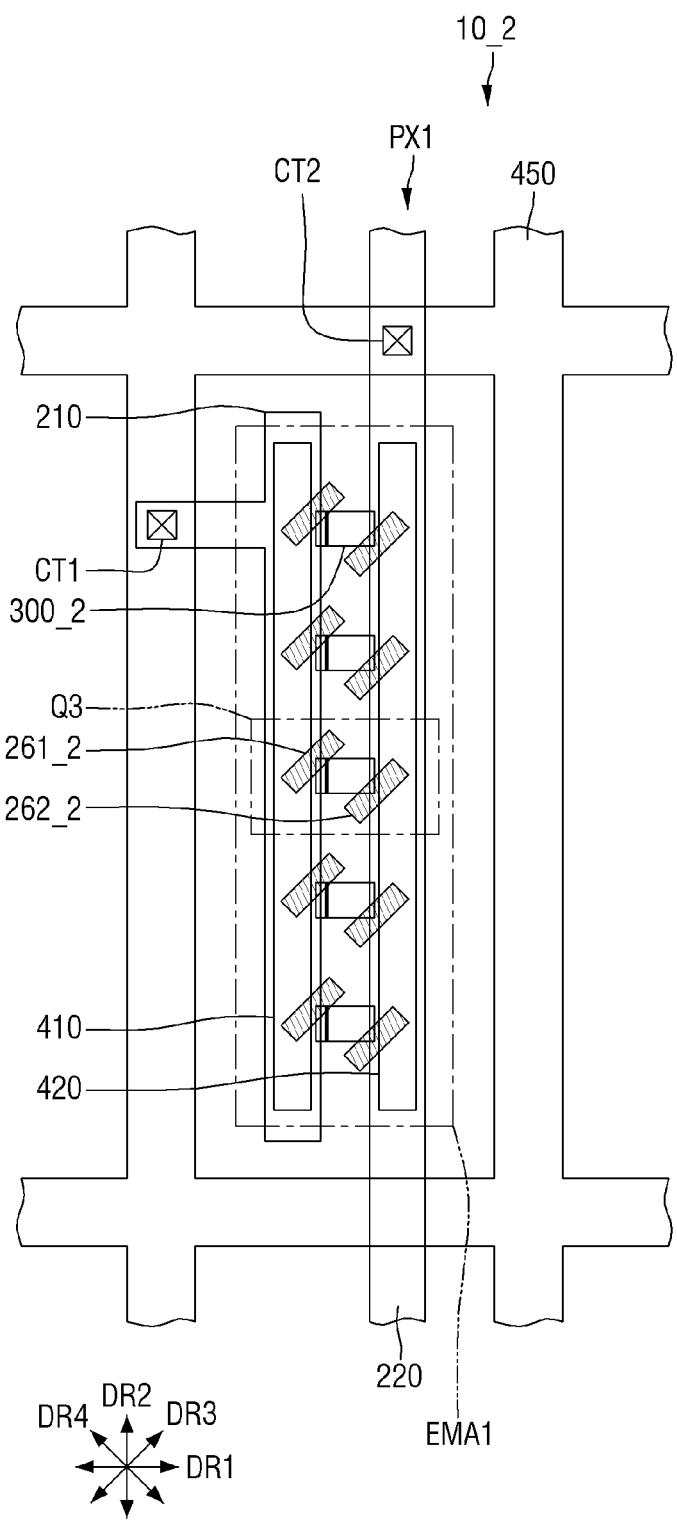
FIG. 11 is a schematic plan view illustrating one sub-pixel of a display device including a light-emitting element according to an embodiment.
Figure 12:
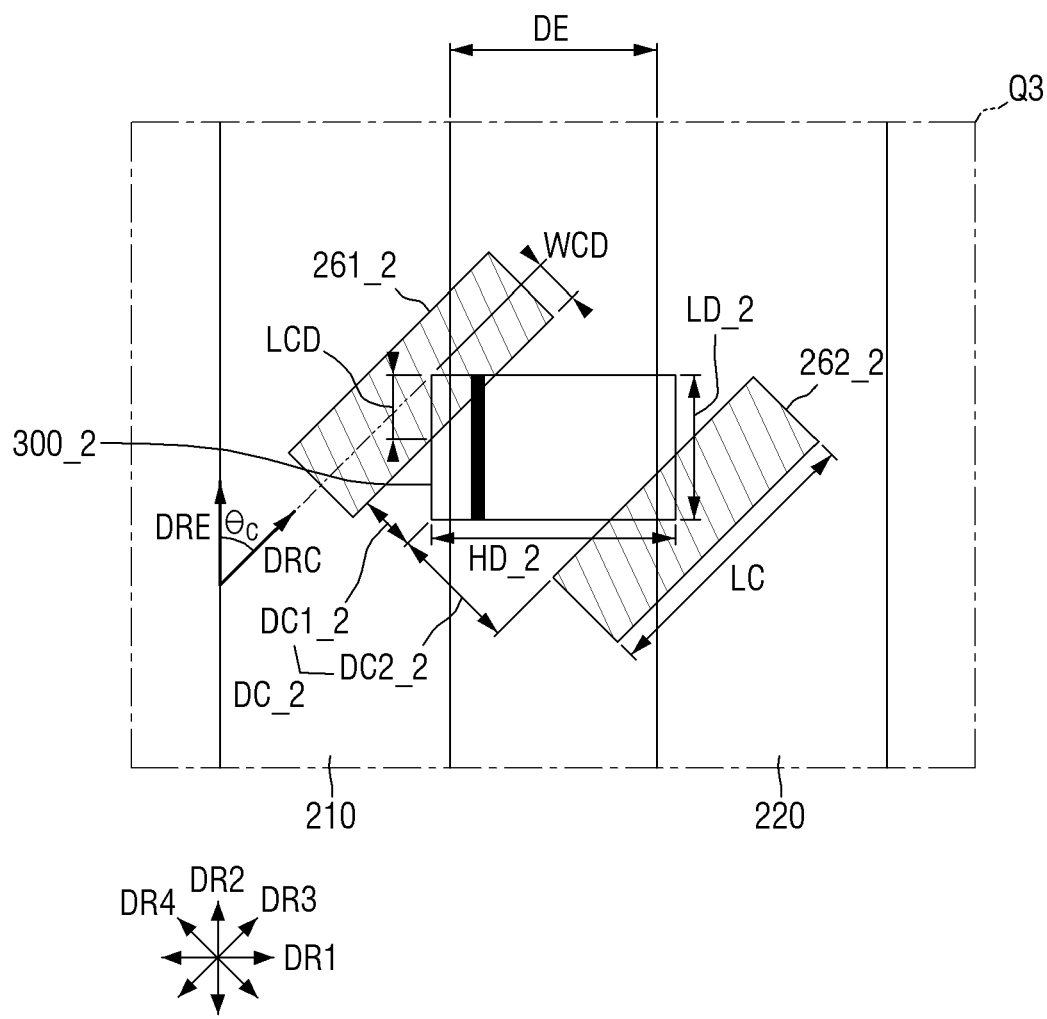
FIG. 12 is an enlarged view of portion Q3 of FIG. 11.

FIG. 11 is a schematic plan view illustrating one sub-pixel of a display device including a light-emitting element according to an embodiment. FIG. 12 is an enlarged view of portion Q3 of FIG. 11.

Referring to FIGS. 11 and 12, a display device 102 according to one embodiment may include a light-emitting element 300_2 having a height HD_2 greater than a length LD_2. Since the light-emitting element 300_2 may include an active layer 330 having a smaller area, the number of light-emitting elements 300_2 disposed in each sub-pixel PXn may be increased.

Further, in a first contact electrode 261_2 and a second contact electrode 262_2 of the display device 102, a separation distance DC_2 (DC1_2, DC2_2) between the first contact electrode 261_2 and the second contact electrode 262_2 and a slope or a first inclination angle θc formed by the first contact electrode 261_2 or the second contact electrode 262_2 and each of electrodes 210 and 220 may vary. Since the length LD_2 of the light-emitting element 300_2 is decreased, the separation distance DC_2 between the first contact electrode 261_2 and the second contact electrode 262_2 may be reduced. However, in case that a process design requires the separation distance DC_2 of a certain level or more, the first inclination angle θc formed by the contact electrodes 261_2 and 262_2 and the electrodes 210 and 220 may be adjusted to secure a sufficient contact area LCD. In case that compared with FIGS. 5 to 7, the contact electrodes 261_2 and 262_2 may be disposed to have a smaller first inclination angle θc, and even in case that a contact distance WCD formed by the light-emitting element 300_2 and the contact electrode 261_2 or 262_2 is small, a sufficient contact area LCD may be secured.

In the display device 10 according to one embodiment, the contact electrodes 261 and 262 may each have a shape extending in a direction not parallel to the extending direction of the electrodes 210 and 220, and may be in contact with the light-emitting element 300. The separation distance DC and the first inclination angle θc of the contact electrodes 261 and 262 may be adjusted within a range in which a required contact area LCD may be secured. The display device 10 has a process advantage of securing a sufficient separation distance DC between the contact electrodes 261 and 262 even in case that the light-emitting element 300 has a relatively small height HD and length LD.

Hereinafter, a display device 10 according to an embodiment will be described.

The display device 10 may be modified in other structures within a range in which the contact electrodes 261 and 262 have a sufficient contact area LCD with the light-emitting element 300 and secure a sufficient separation distance DC. As an example, the electrodes 210 and 220 of the display device 10 may have a structure in which the light-emitting element 300 may be disposed in a specific or selected location.

Figure 13:
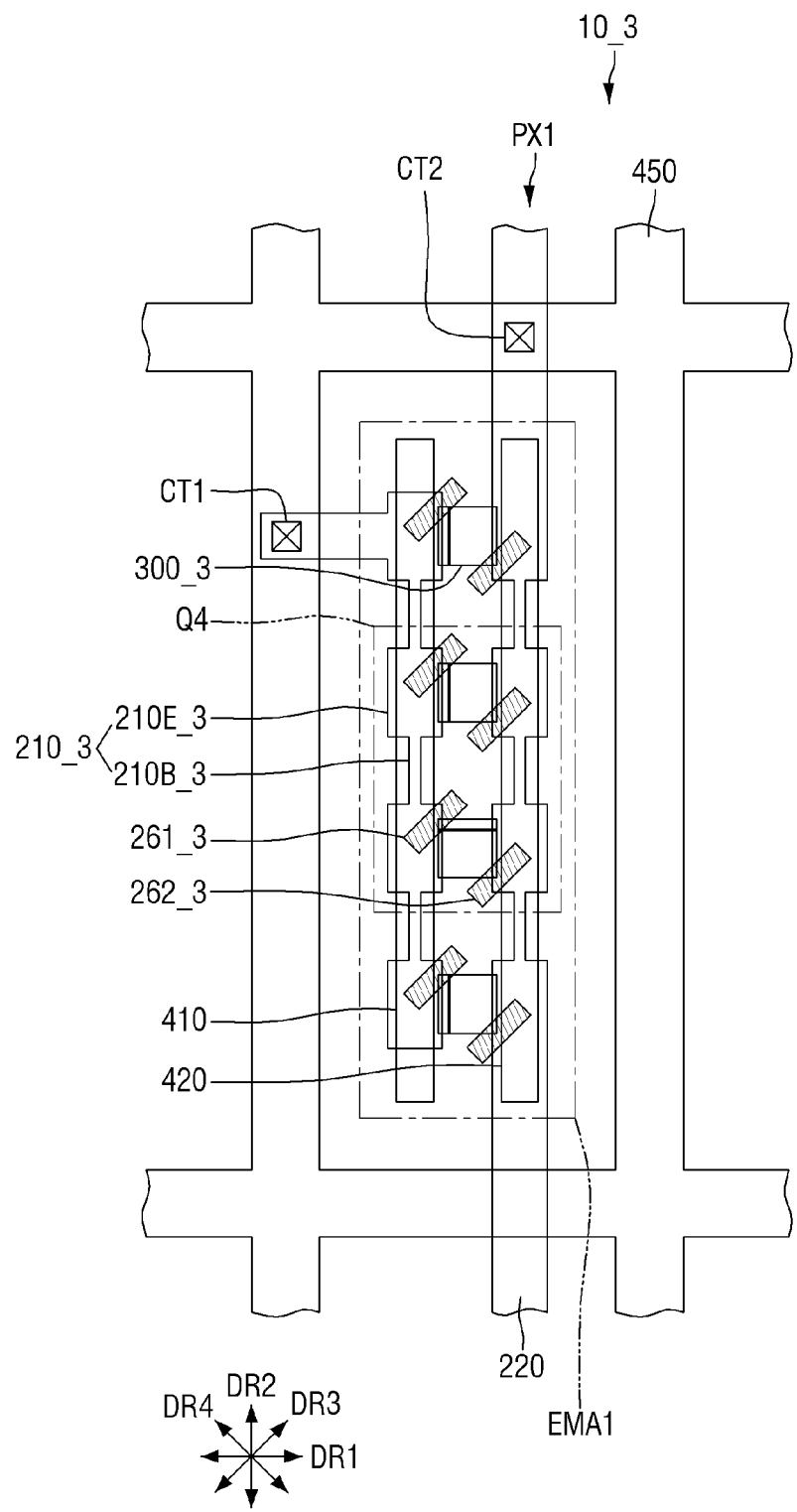
FIG. 13 is a schematic plan view illustrating one sub-pixel of a display device according to an embodiment.
Figure 14:
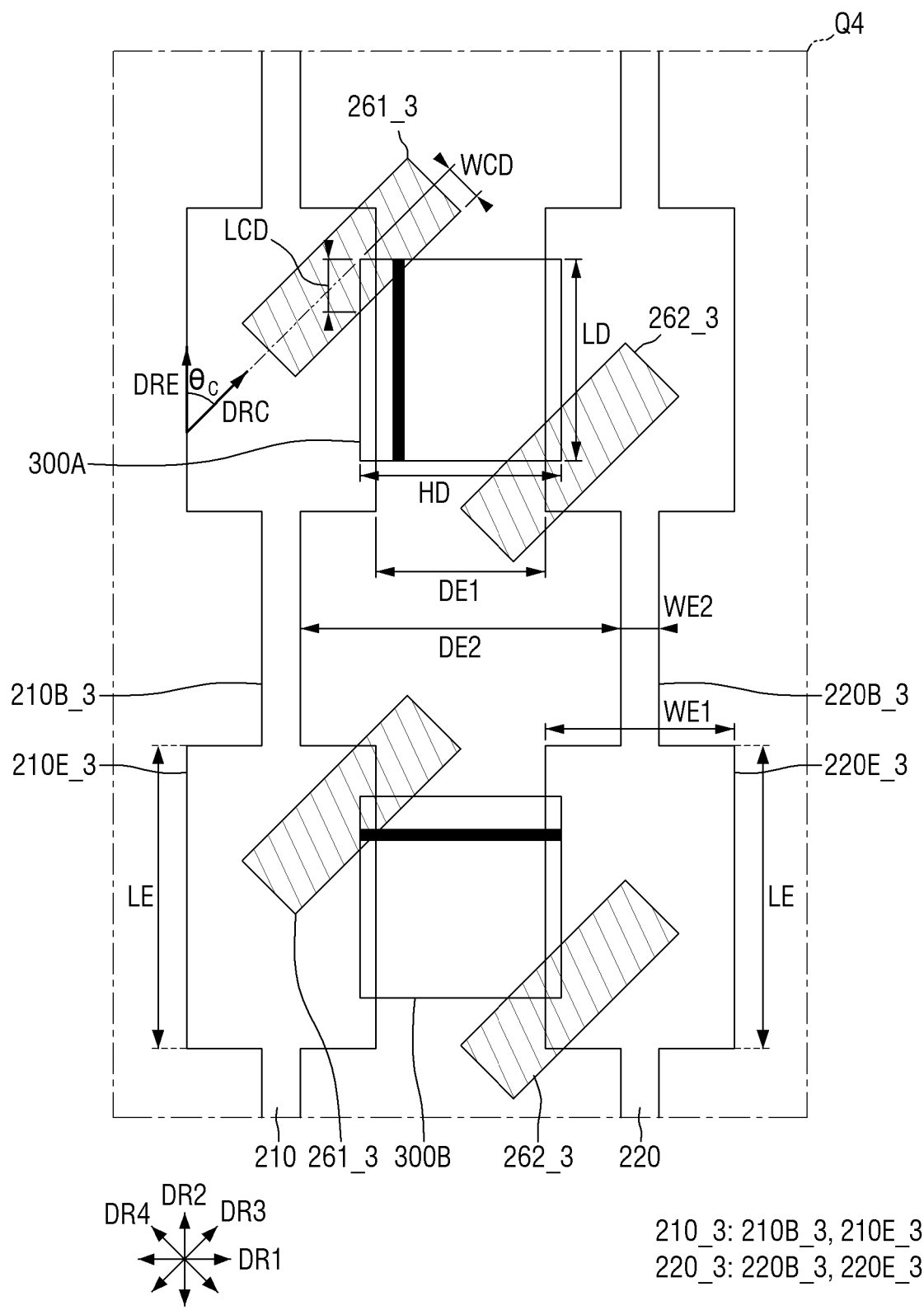
FIG. 14 is an enlarged view of portion Q4 of FIG. 13.

FIG. 13 is a schematic plan view illustrating one sub-pixel of a display device according to an embodiment. FIG. 14 is an enlarged view of portion Q4 of FIG. 13. FIG. 14 illustrates by omitting a first inner bank 410 and a second inner bank 420 of FIG. 13 for convenience of description.

Referring to FIGS. 13 and 14, in a display device 10_3 according to one embodiment, a first electrode 210_3 and a second electrode 220_3 may each include a portion having different widths. The display device 10_3 of FIGS. 13 and 14 may be different from that of the embodiment of FIG. 2 in that each of the electrodes 210_3 and 220_3 may have a portion whose width is changed in a direction in which the electrodes 210_3 and 220_3 extend. Hereinafter, repeated descriptions will be omitted, and descriptions will be provided based on differences from the above-described contents.

The electrodes 210_3 and 220_3 of the display device 10_3 may include electrode expansion portions 210E_3 and 220E_3, which are portions having a large width, and electrode connection portions 210B_3 and 220B_3, respectively, wherein the connection portion 210B_3 connects the expansion portions 210E_3 and the connection portion 220B_3 connects the extension portions 220E_3. For example, the first electrode 210_3 may include first electrode expansion portions 210E_3 and a first electrode connection portion 210B_3 formed therebetween, and the second electrode 220_3 may include second electrode extension portions 220E_3 and a second electrode connection portion 220B_3 formed therebetween. The first electrode 210_3 and the second electrode 220_3 may each have a shape extending in one direction or a direction, for example, the second direction DR2, and may respectively include the electrode connection portions 210B_3 and 220B_3 partially having a small width. The first electrode 210_3 may have a shape in which the electrode expansion portions 210E_3 are disposed to be spaced apart from each other in the second direction DR2 and the electrode connection portion 210B_3 connects the electrode expansion portions 210E_3, and the second electrode 220_3 may have a shape in which the electrode extension portions 220E_3 are disposed to be spaced apart from each other in the second direction DR2 and the electrode connection portion 220B_3 connects the electrode extension portions 220E_3.

According to one embodiment, a width WE1 of each of the electrode expansion portions 210E_3 and 220E_3 may be greater than a width WE2 of each of the electrode connection portions 210B_3 and 220B_3. Accordingly, a separation distance between the first electrode 210_3 and the second electrode 220_3 may have a first separation distance DE1 between the electrode expansion portions 210E_3 and 220E_3 and a second separation distance DE2 between the electrode connection portions 210B_3 and 220B_3, and the first separation distance DE1 may have a value less than that of the second separation distance DE2.

Light-emitting elements, for example, 300_3, may be aligned between the electrodes 210_3 and 220_3 by an electric field generated between the electrodes 210_3 and 220_3 while changing locations and orientation directions. Here, in case that the separation distance between the electrodes 210_3 and 220_3 may include a portion smaller than the other portions, the electric field may be formed more strongly in the portion having a small width. For example, like the first electrode expansion portion 210E_3 and the second electrode extension portion 220E_3, in case that the electrodes 210_3 and 220_3 are disposed to be spaced apart from each other with the smaller first separation distance DE1, the light-emitting elements 300 may be disposed, for example, between the electrode expansion portions 210E_3 and 220E_3 than a region between the electrode connection portions 210B_3 and 220B_3. In case that a light-emitting element 300 is disposed between one electrode expansion portion 210E_3 and one electrode expansion portion 220E_3, other light-emitting elements 300 may be disposed between the other electrode expansion portions 210E_3 and 220E_3 without overlapping the light-emitting element 300. For example, the electrodes 210_3 and 220_3 may guide the light-emitting elements 300 to be disposed at specific or selected locations by including the electrode expansion portions 210E_3 and 220E_3 and the electrode connection portions 210B_3 and 220B_3.

Further, as described above, contact electrodes 261_3 and 262_3 may be disposed to correspond to the light-emitting element 300, and in the display device 10_3 of FIGS. 13 and 14, the contact electrodes 261_3 and 262_3 may be disposed to correspond to the electrode expansion portions 210E_3 and 220E_3. Since the electrodes 210_3 and 220_3 may guide the light-emitting elements 300 to be disposed at specific or given or selected locations by including the electrode expansion portions 210E_3 and 220E_3, the locations of the light-emitting elements 300 may be specified so that the arrangement and structure of the contact electrodes 261_3 and 262_3 may be readily specified.

Further, the contact electrodes 261_3 and 262_3 may be disposed on the basis of the electrode expansion portions 210E_3 and 220E_3 to have a specific or selected separation distance DC and first inclination angle θc. However, the electrode expansion portions 210E_3 and 220E_3 may each have a length LE having a value within a range in which the light-emitting element 300 disposed therebetween and the contact electrode 261_3 or 262_3 have a sufficient contact area LCD.

According to one embodiment, the length LE of each of the electrode expansion portions 210E_3 and 220E_3 may be greater than a length LD or a height HD of the light-emitting element 300, but may be less than or equal to the sum of the length LD or the height HD and a length of the contact area LCD. Since the light-emitting elements 300 may be disposed with a random density and separation distance between the electrodes 210_3 and 220_3, it may be important to determine the location and shape of each of the contact electrodes 261_3 and 262_3, which are disposed with the first inclination angle θc, in order to secure the required contact area LCD. In a case in which the length LE of each of the electrode expansion portions 210E_3 and 220E_3 satisfies the above-described range, in case that the contact electrodes 261_3 and 262_3 are disposed at a specific or selected separation distance DC and first inclination angle θc corresponding to the location and length of each of the electrode expansion portions 210E_3 and 220E_3, the light-emitting elements 300 disposed between the electrode expansion portions 210E_3 and 220E_3 may each have the required contact area LCD regardless of the locations of the light-emitting elements 300

Since the first electrode 210_3 and the second electrode 220_3 include the electrode connection portions 210B_3 and 220B_3 each having a relatively small width, inner banks 410 and 420 may include portions that do not overlap the electrodes 210_3 and 220_3 in the thickness direction. For example, a width of each of the inner banks 410 and 420, which is measured in one direction or a direction, may less than the width WE1 of each of the electrode expansion portions 210E_3 and 220E_3, and may be greater than the width WE2 of each of the electrode connection portions 210B_3 and 220B_3. As shown in FIG. 13, portions of upper surfaces of the inner banks 410 and 420, on which the electrode connection portions 210B_3 and 220B_3 are disposed, may not overlap the electrodes 210_3 and 220_3. On the other hand, the upper surfaces of the inner banks 410 and 420, on which the electrode expansion portions 210E_3 and 220E_3 are disposed, may be covered or overlapped by the electrodes 210_3 and 220_3. However, the disclosure is not limited thereto.

The first electrode 210 and the second electrode 220 may have a structure in which the light-emitting elements 300 may be guided to be disposed at specific or selected locations similar to the display device 10_3 of FIGS. 13 and 14.

Figure 15:
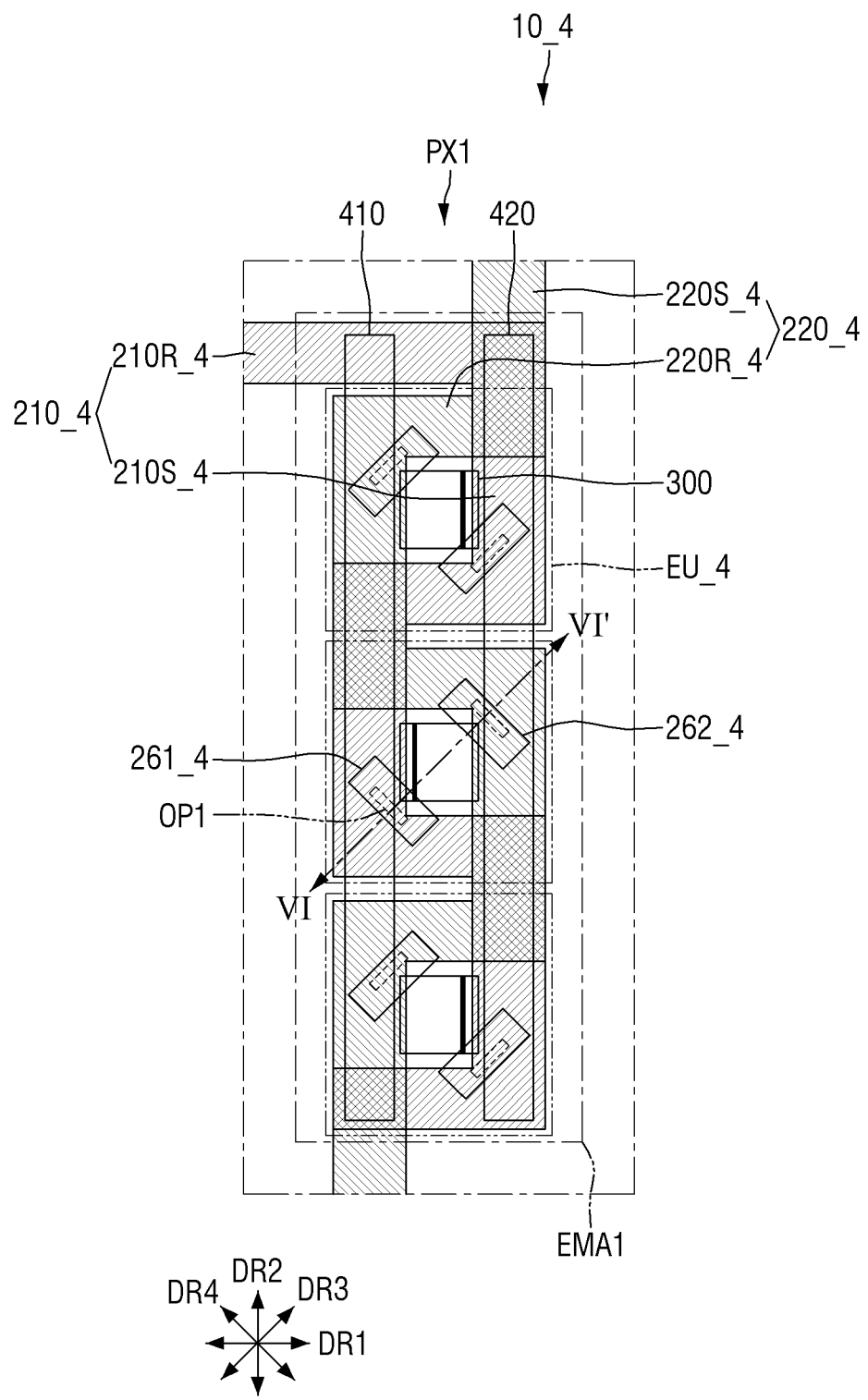
FIG. 15 is a schematic plan view illustrating an electrode structure of a display device according to an embodiment.

FIG. 15 is a schematic plan view illustrating an electrode structure of a display device according to an embodiment.

Referring to FIG. 15, in a display device 10_4 according to one embodiment, electrodes 210_4 and 220_4 may respectively include portions extending in different directions. A first electrode 210_4 may include a first electrode extension portion 210S_4 extending in the second direction DR2 and a first electrode bent portion 210R_4 bent from the first electrode extension portion 210S_4 in the first direction DR1. A second electrode 220_4 may include a second electrode extension portion 220S_4 extending in the second direction DR2 and a second electrode bent portion 220R_4 bent from the second electrode extension portion 220S_4 in the first direction DR1. The first electrode 210_4 and the second electrode 220_4 may have a structure in which the electrode extension portions 210S_4 and 220S_4 and the electrode bent portions 210R_4 and 220R_4 are respectively and alternately connected.

The first electrode 210_4 and the second electrode 220_4 may be disposed along the second direction DR2 in each sub-pixel PXn, and may each have a shape bent several times. The first electrode 210_4 and the second electrode 220_4 may be bent several times and disposed to cross or intersect each other, and thus may be partially disposed on a first inner bank 410 and a second inner bank 420, respectively. In a region in which the first electrode 210_4 and the second electrode 220_4 cross or intersect each other, one electrode extension portion 210S_4 or 220S_4 may partially overlap the electrode bent portion 210R_4 or 220R_4 of another electrode.

The first electrode extension portion 210S_4 and the second electrode extension portion 220S_4 may be spaced apart from each other in the first direction DR1, and the first electrode bent portion 210R_4 and the second electrode bent portion 220R_4 may be spaced apart from each other in the second direction DR2. The electrode extension portions 210S_4 and 220S_4 and the electrode bent portions 210R_4 and 220R_4 of the electrodes 210_4 and 220_4 may be spaced apart from each other in the first direction DR1 and the second direction DR2, and may partially form an electrode unit portion EU_4. One electrode unit portion EU_4 may include a region surrounded by the first electrode bent portion 210R_4, the first electrode extension portion 210S_4, the second electrode bent portion 220R_4, and the second electrode extension portion 220S_4. The first electrode 210_4 and the second electrode 220_4 may include electrode extension portions 210S_4 and 220S_4 and electrode bent portions 210R_4 and 220R_4 so that electrode unit portions EU_4 are formed in a region. The electrode extension portions 210S_4 and 220S_4 and the electrode bent portions 210R_4 and 220R_4 of the electrode unit portion EU_4 may be disposed to surround a region, and an electric field generated between the electrodes 210_4 and 220_4 may be formed in the region.

Accordingly, the electrodes 210_4 and 220_4 may guide light-emitting elements 300 to be disposed at specific or selected locations similar to the embodiment of FIGS. 13 and 14. A first contact electrode 261_4 and a second contact electrode 262_4 are disposed to correspond to a location of the electrode unit portion EU_4 so that the first contact electrode 261_4 and the second contact electrode 262_4 may be disposed to correspond to the light-emitting element 300. In the display device 10_4, since the electrodes 210_4 and 220_4 form the electrode unit portion EU_4, the light-emitting elements 300 may be guided to be disposed at specific or given or selected locations, and since the locations of the light-emitting elements 300 are specified, the arrangement and structure of the contact electrodes 261_4 and 262_4 may be readily specified.

Further, the first electrode 210_4 and the second electrode 220_4 may be disposed along the second direction DR2 and may have a shape bent several times, and the first electrode 210_4 and the second electrode 220_4 may be disposed at different locations with respect to a center portion of each electrode unit portion EU_4. For example, the first electrode 210_4 may be disposed at a left side and a lower side with respect to the center portion of any one electrode unit portion EU_4, and the first electrode 210_4 may be disposed at a right side and the lower side with respect to the center portion of another electrode unit portion EU_4. In the light-emitting elements 300 disposed in each of the electrode unit portions EU_4, a direction in which the active layer 330 faces may vary.

In an embodiment, the contact electrodes 261_4 and 262_4 may each have a shape extending in a direction crossing or intersecting directions in which the electrode extension portions 210S_4 and 220S_4 and the electrode bent portions 210R_4 and 220R_4 extend. As described above, the contact electrodes 261_4 and 262_4 may each have a shape extending with a first inclination angle θc with respect to a direction in which each of the electrodes 210_4 and 220_4 extends. Similarly, in the display device 10_4 of FIG. 15, the contact electrodes 261_4 and 262_4 may each have a shape extending in a direction different from those of the electrode extension portions 210S_4 and 220S_4 and the electrode bent portions 210R_4 and 220R_4.

Further, the contact electrodes 261_4 and 262_4 may be disposed on bent portions at which the electrode extension portions 210S_4 and 220S_4 and the electrode bent portions 210R_4 and 220R_4 are connected, respectively, so that the contact electrodes 261_4 and 262_4 may be in contact with both sides of the light-emitting element 300 disposed in a space formed by the electrode unit portion EU_4. As described above, since the locations of the first electrode 210_4 and the second electrode 220_4 vary with respect to the center portion of each of the electrode unit portions EU_4, the locations of the first contact electrode 261_4 and the second contact electrode 262_4 may also be changed to correspond to the first electrode 210_4 and the second electrode 220_4, respectively. However, a detailed description thereof will be omitted.

Since the first electrode 210_4 and the second electrode 220_4 are bent several times and disposed, the first electrode 210_4 and the second electrode 220_4 may partially overlap each other in the thickness direction. According to one embodiment, in the display device 10_4, the first electrode 210_4 and the second electrode 220_4 may be disposed in different layers, and another insulating layer may be further disposed therebetween.

Figure 16:
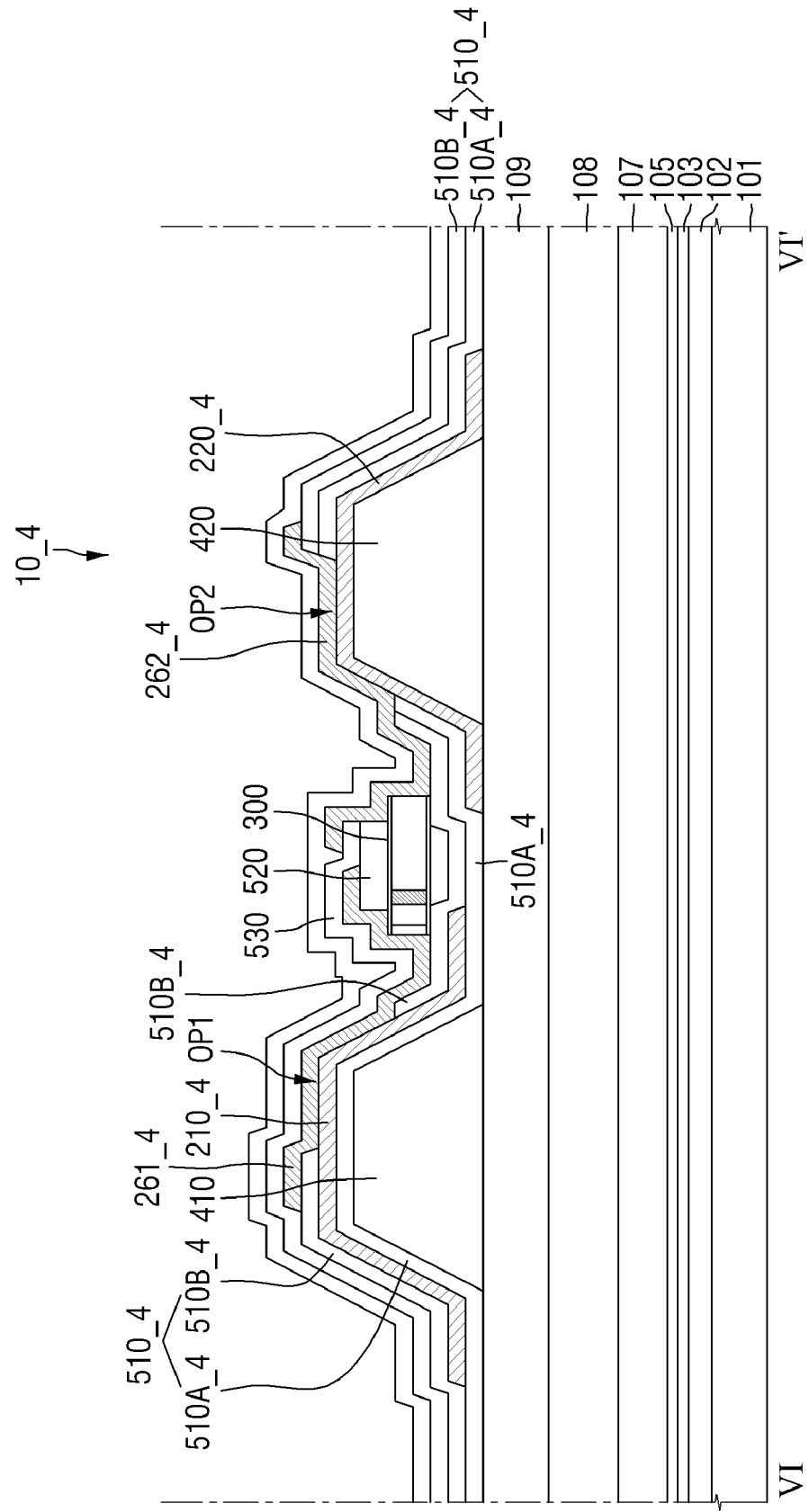
FIG. 16 is a schematic cross-sectional view taken along line VI-VI' of FIG. 15.

FIG. 16 is a schematic cross-sectional view taken along line VI-VI' of FIG. 15.

Referring to FIG. 16, in the display device 10_4 according to one embodiment, a first insulating layer 510_4 may include a first layer 510A_4 and a second layer 510B_4, the first electrode 210_4 may be disposed on the second layer 510B_4, and the second electrode 220_4 may be disposed between the first layer 510A_4 and the second layer 510B_4. The display device 10_4 of FIG. 16 may be different from that of the embodiment of FIG. 3 in that the first electrode 210_4 and the second electrode 220_4 may be disposed in different layers, and the first insulating layer 510_4 is formed of layers. Hereinafter, repeated descriptions will be omitted, and descriptions will be provided based on differences from the above-described contents.

In the display device 10_4, since the first electrode 210_4 and the second electrode 220_4 are disposed in different layers, as shown in FIG. 15, the first electrode 210_4 and the second electrode 220_4 may partially overlap each other in the thickness direction.

The second electrode 220_4 may be disposed on or directly disposed on the first inner bank 410 or the second inner bank 420. In FIG. 16, the second electrode 220_4 is illustrated as being disposed on the second inner bank 420, but the disclosure is not limited thereto. Since the second electrode 220_4 may be disposed similar to the second electrode 220 of FIG. 3, a detailed description thereof will be omitted.

The first layer 510A_4 may be disposed on the first inner bank 410 or the second inner bank 420 and the second electrode 220_4. The first layer 510A_4 may be disposed to cover or overlap the second electrode 220_4, and may be disposed similar to the first insulating layer 510 of FIG. 3.

The first electrode 210_4 may be disposed on the first layer 510A_4 on the first inner bank 410 or the second inner bank 420. In FIG. 16, the first electrode 210_4 is illustrated as being disposed on the first inner bank 410, but the disclosure is not limited thereto. Although not shown in the drawing, the first electrode 210_4 and the second electrode 220_4 may partially overlap each other in the thickness direction but may not be directly connected to each other as the first layer 510A_4 is disposed therebetween.

The second layer 510B_4 may be disposed on the first layer 510A_4, including the first electrode 210_4. The second layer 510B_4 and the first layer 510A_4 may be disposed in substantially a same shape but may have partially different shapes due to the first electrode 210_4 disposed therebetween. The light-emitting element 300 may be disposed on or directly disposed on the second layer 510B_4 between the first electrode 210_4 and the second electrode 220_4.

The first insulating layer 510_4 may include openings OP1 and OP2 exposing portions of upper surfaces of the first electrode 210_4 and the second electrode 220_4 so that the first contact electrode 261_4 and the second contact electrode 262_4 may be in contact with the first electrode 210_4 and the second electrode 220_4, respectively. In the first insulating layer 510_4, a first opening OP1 exposing a portion of the upper surface of the first electrode 210_4 may be formed in a region overlapping the first contact electrode 261_4. In the first opening OP1, a portion of the second layer 510B_4 may be removed to expose a portion of the upper surface of the first electrode 210_4. The first contact electrode 261_4 may be in direct contact with the first electrode 210_4 exposed through the first opening OP1.

In the first insulating layer 510_4, a second opening OP2 exposing a portion of the upper surface of the second electrode 220_4 may be formed in a region overlapping the second contact electrode 262_4. In the second opening OP2, portions of the first layer 510A_4 and the second layer 510B_4 may be removed to expose a portion of the upper surface of the second electrode 220_4. The second contact electrode 262_4 may be in direct contact with the second electrode 220_4 exposed through the second opening OP2.

According to one embodiment, in the display device 10_4, the first insulating layer 510_4 may include layers 510A_4 and 510 B_4 so that the first electrode 210_4 and the second electrode 220_4 may be disposed in different layers.

Figure 17:
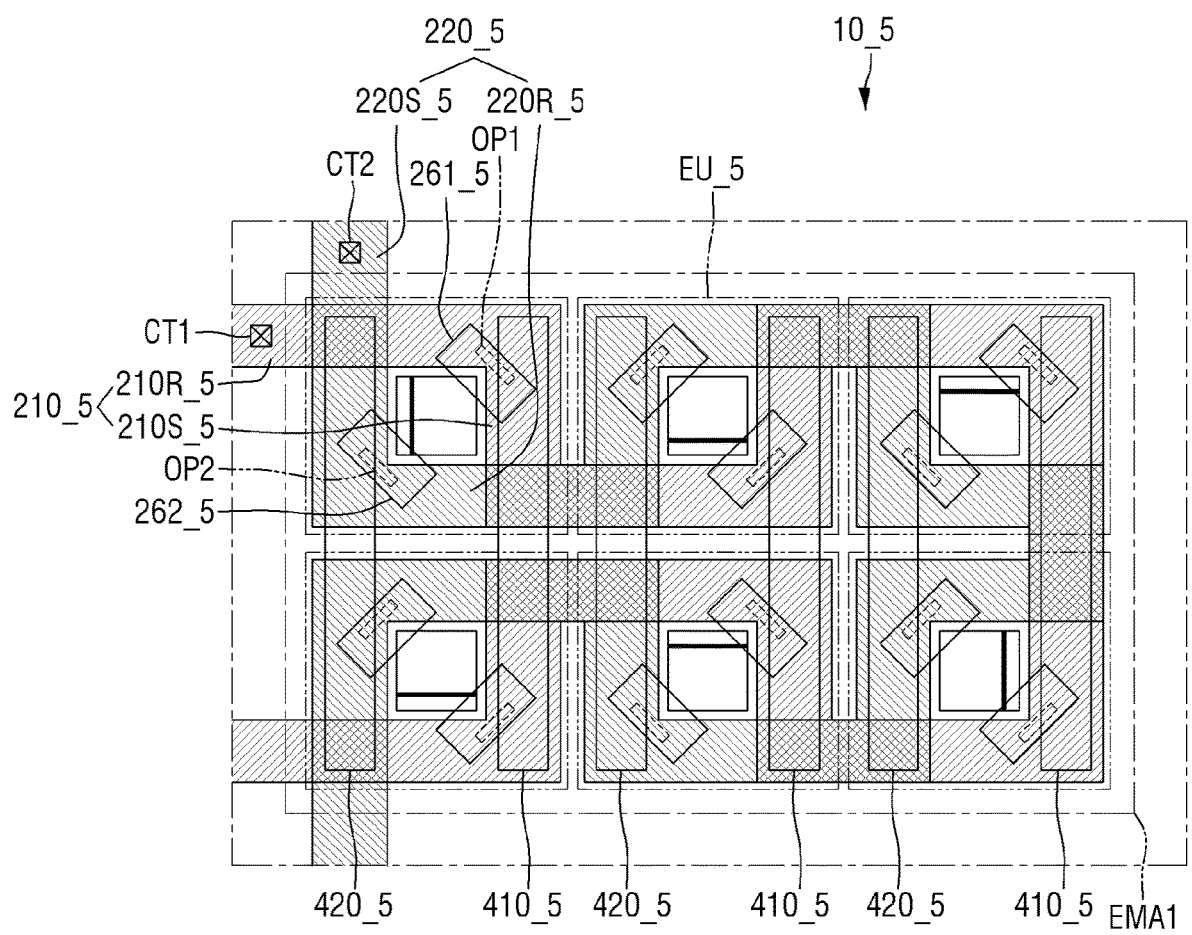
FIG. 17 is a schematic plan view illustrating an electrode structure of a display device according to an embodiment.

FIG. 17 is a schematic plan view illustrating an electrode structure of a display device according to an embodiment.

Referring to FIG. 17, in a display device 10_5 according to one embodiment, a first electrode 210_5 and a second electrode 220_5 include a larger number of electrode extension portions 210S_5 and 220S_5 and electrode bent portions 210R_5 and 220R_5 so that a larger number of electrode unit portions EU_5 may be formed. The electrode unit portions EU_5 are not necessarily arranged (or disposed) in one direction or in a direction and may be arranged (or disposed) in different directions. In the display device 10_5 of FIG. 17, the electrode unit portions EU_5 may be arranged (or disposed) in the first direction DR1 and the second direction DR2. Accordingly, a first inner bank 410_5 and a second inner bank 420_5 may also be disposed in a larger number, and the number of light-emitting elements 300 disposed in a region may be increased. The display device 10_5 of FIG. 17 may be different from that of the embodiment of FIG. 15 in that a larger number of electrode unit portions EU_5 may be formed. Hereinafter, repeated descriptions will be omitted.

In the display device 10, in case that the first electrode 210 and the second electrode 220 are disposed to surround a region to secure a space in which the light-emitting element 300 is disposed, the shape of each of the first electrode 210 and the second electrode 220 may be variously modified.

Figure 18:
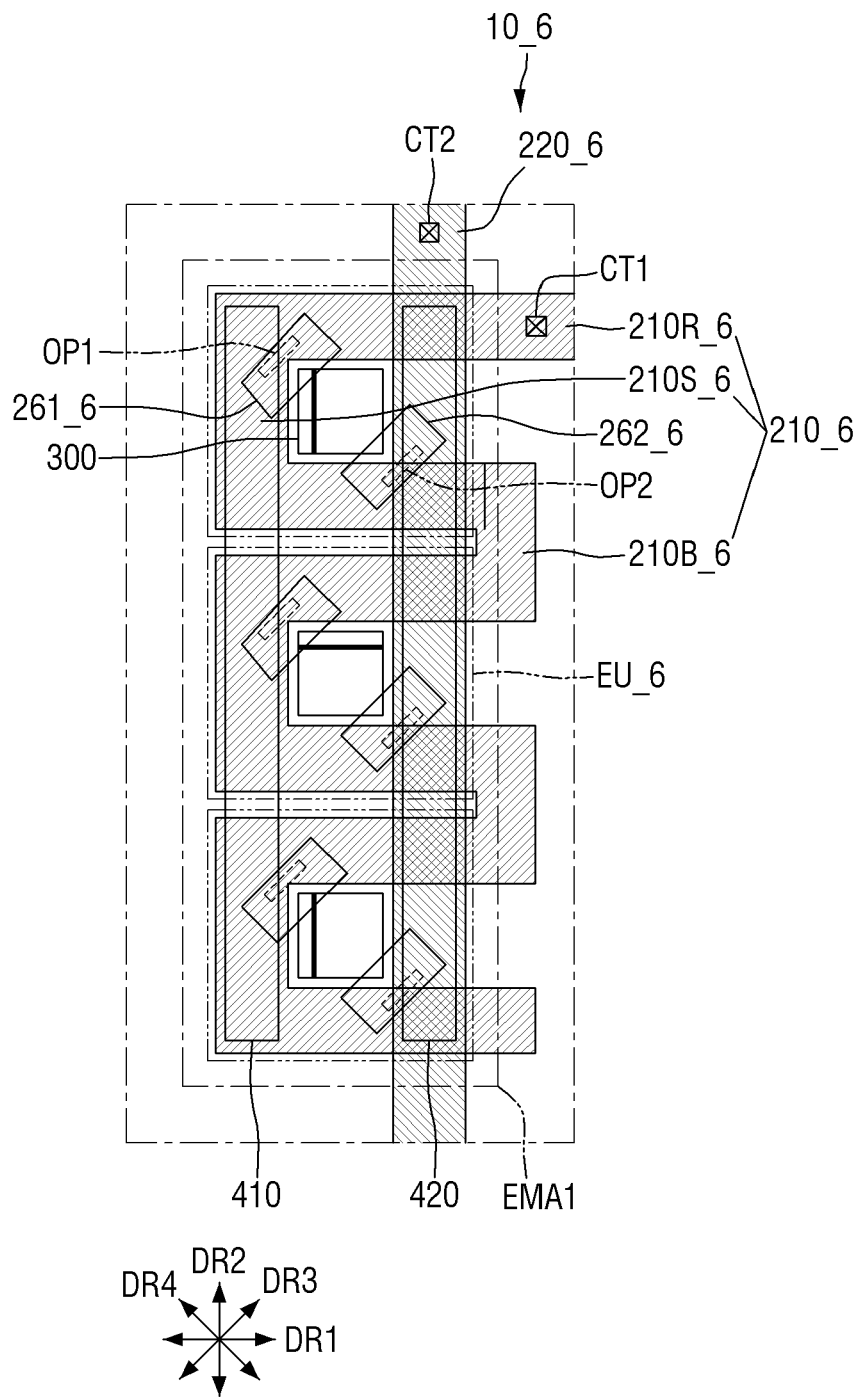
FIGS. 18 to 20 are schematic plan views each illustrating an electrode structure of a display device according to an embodiment.
Figure 19:
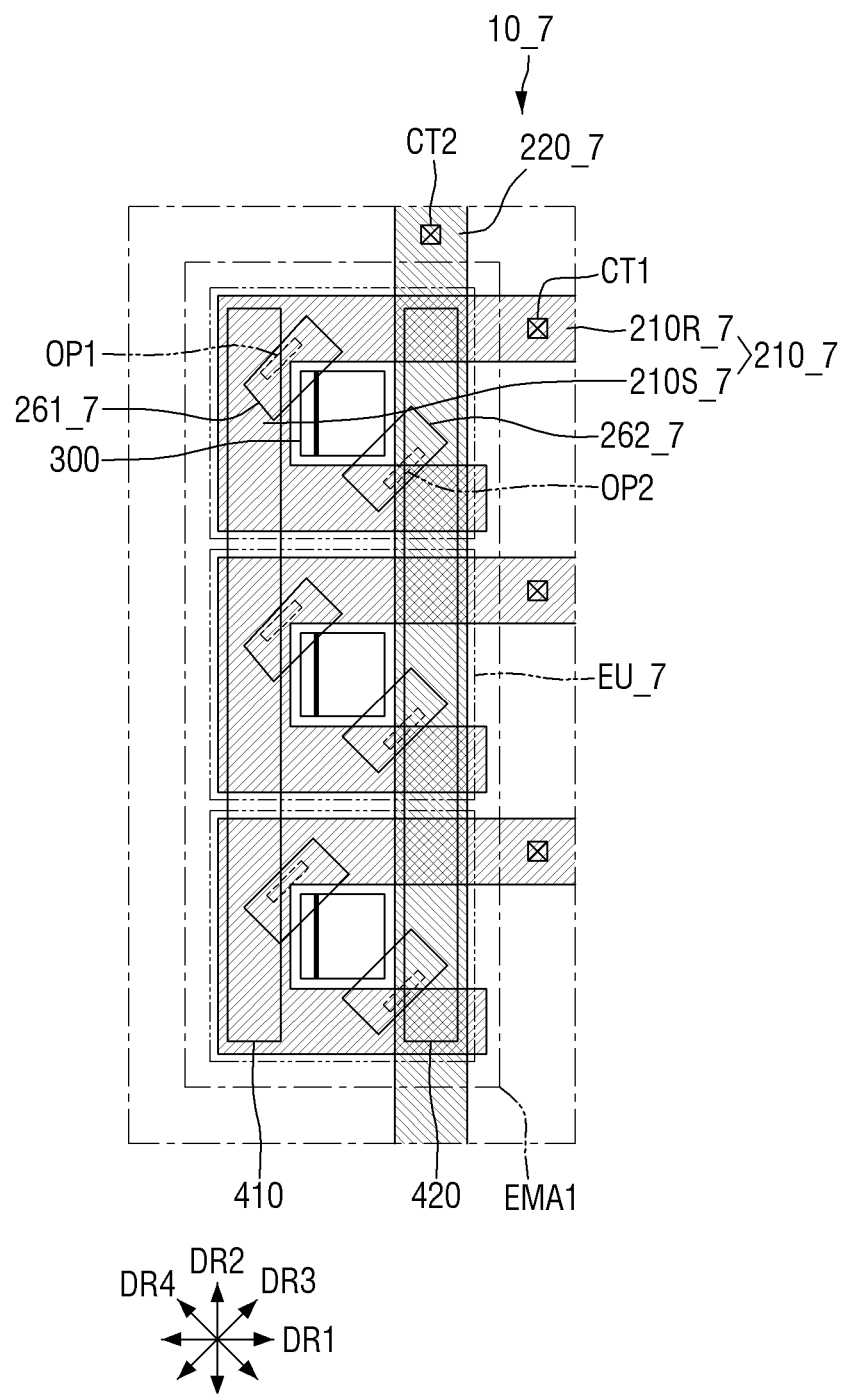
Figure 20:
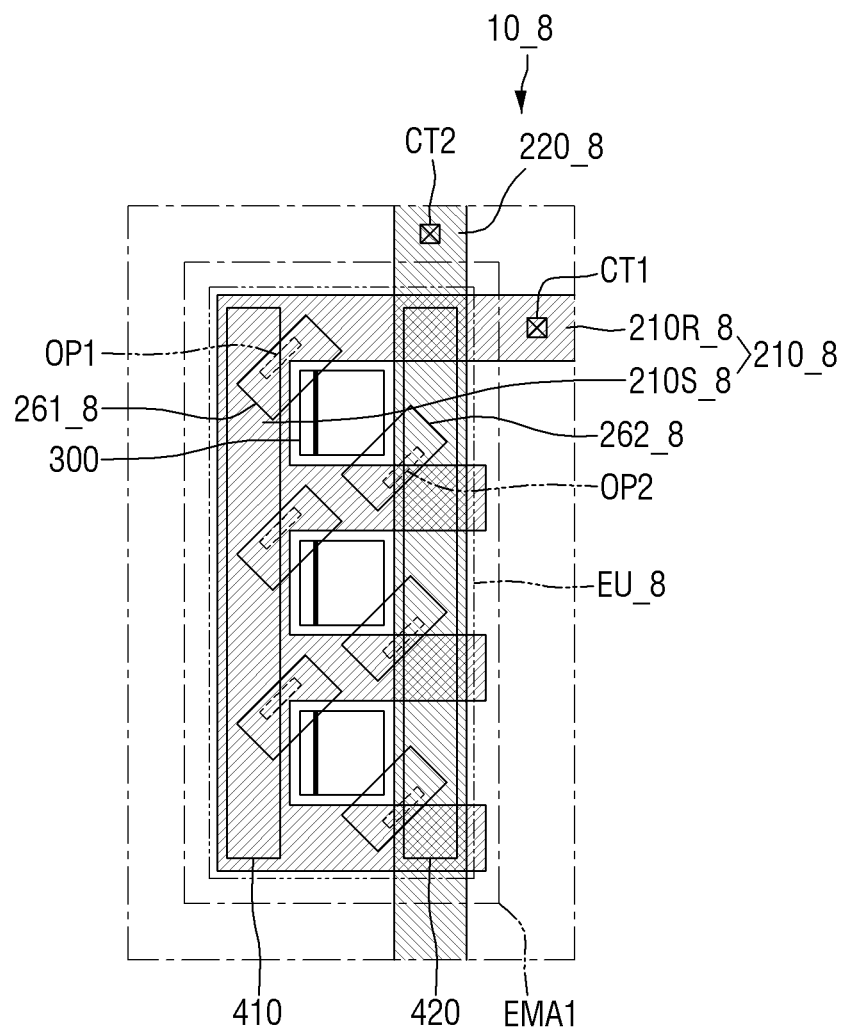

FIGS. 18 to 20 are schematic plan views each illustrating an electrode structure of a display device according to an embodiment.

Referring to FIG. 18, in a display device 10_6 according to one embodiment, unlike a first electrode 210_6, a second electrode 220_6 may have a shape extending in one direction or in a direction without including a bent electrode bent portion, and in the first electrode 210_6, a first electrode extension portion 210S_6 and a first electrode bent portion 210R_6 may be disposed to surround a region with respect to the second electrode 220_6. Accordingly, one electrode unit portion EU_6 may be formed by the second electrode 220_6, the first electrode extension portion 210S_6, which is spaced apart from the second electrode 220_6, and the two first electrode bent portions 210R_6. The display device 10_6 of FIG. 18 may be different from that of the embodiment of FIG. 15 in that the structures of the first electrode 210_6 and the second electrode 220_6 may be different from each other. Hereinafter, repeated descriptions will be omitted, and the arrangement of the first electrode 210_6 and the second electrode 220_6 will be described.

The second electrode 220_6 may be disposed to extend in one direction or a direction, for example, the second direction DR2, as shown in the display device 10 of FIG. 2. A detailed description thereof will be omitted.

The first electrode 210_6 may include the first electrode extension portion 210S_6 extending in the second direction DR2 and the first electrode bent portions 210R_6, which are bent in the first direction DR1 from both sides of the first electrode extension portion 210S_6. The first electrode extension portion 210S_6 may be disposed to be spaced apart from the second electrode 220_6 in the first direction DR1, and the first electrode bent portions 210R_6 may be bent toward the second electrode 220_6. Accordingly, the second electrode 220_6, the first electrode extension portion 210S_6, and two first electrode bent portions 210R_6 may form one electrode unit portion EU_6 to form a region in which the light-emitting element 300 may be disposed.

The first electrode 210_6 may further include a first electrode connection portion 210B_6 to interconnect the first electrode bent portions 210R_6 of the adjacent electrode unit portions EU_6. The first electrode 210_6 may further include the first electrode connection portion 210B_6 to be integrated into one electrode line, and an electrical signal may be transmitted through one first contact hole CT1. However, the disclosure is not limited thereto.

Referring to FIG. 19, in a display device 10_7 according to one embodiment, a first electrode connection portion 210B_6 may be omitted from a first electrode 210_7, and the display device 107 may include separated first electrodes 210_7 (and 220_7) for each electrode unit portion EU_7. An electrical signal may be transmitted to a first electrode bent portion 210R_7 of each electrode unit portion EU_7 through a first contact hole CT1. FIG. 19 further includes a first electrode extension portion 210S_7.

Further, referring to FIG. 20, in a display device 10_8 including electrode unit portion EU_8 according to one embodiment, a first electrode 210_8 may include one first electrode extension portion 210S_8 and may be disposed to be spaced apart from a second electrode 220_8, and first electrode bent portions 210R_8 may each have a shape bent toward the second electrode 220_8. One first electrode extension portion 210S_8 and the first electrode bent portions 210R_8 may be integral with one first electrode 210_8. The display devices 10_7 and 10_9 of FIGS. 19 and 20 may be different from the display device 10_6 of FIG. 18 in that the shapes of the first electrodes 210_7 and 210_8 may be different. Hereinafter, repeated descriptions will be omitted.

Figure 21:
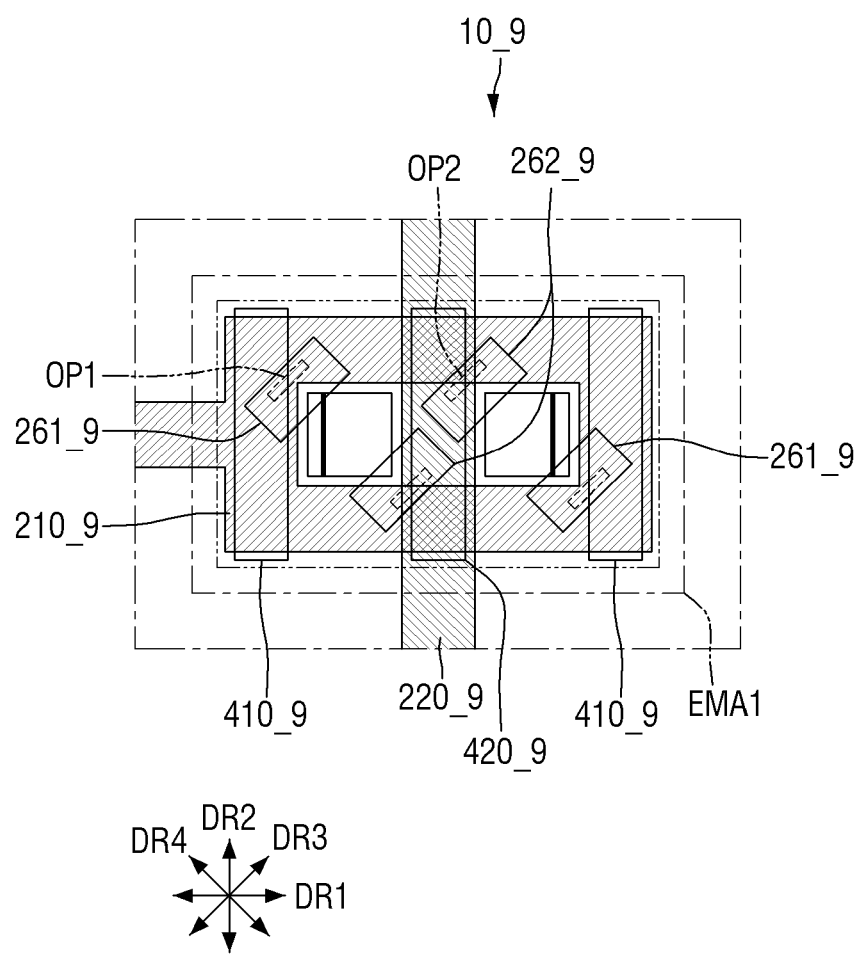
FIG. 21 is a schematic plan view illustrating an electrode structure of a display device according to an embodiment.

FIG. 21 is a schematic plan view illustrating an electrode structure of a display device according to an embodiment.

Referring to FIG. 21, in a display device 10_9 according to one embodiment, a first electrode 210_9 may be disposed to have a shape surrounding a space, and a second electrode 220_9 may be disposed to cross or intersect the space. The first electrode 210_9 may include a portion extending in the first direction DR1 and a portion extending in the second direction DR2 so that the light-emitting elements 300 may be disposed in a space surround by the portions. The second electrode 220_9 may be disposed to extend in the second direction DR2 while crossing or intersecting a center of the space, and light-emitting elements 300 may be disposed in a space surrounded by the first electrode 210_9. The display device 10_9 of FIG. 21 may be different from that of the embodiment of FIG. 18 in that the shape of the first electrode 210_9 may be different. Other repeated descriptions will be omitted. FIG. 21 may also include a first inner bank 410_9 and a second inner bank 420_9.

It is to be further understood that FIGS. 17 through 21 may also include contact electrodes, 261_5, 262_5, 261_6, 262_6, 261_7, 262_7, 261_8, 262_8, 261_9, and 262_9, respectively, but are not limited thereto.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a first electrode extending in a first direction;
   a second electrode extending in the first direction and spaced apart from the first electrode in a second direction intersecting the first direction;
   a light-emitting element having a shape extending in one direction and disposed between the first electrode and the second electrode and the one direction is parallel to the second direction;
   a first contact electrode having a shape extending in a third direction intersecting the first direction and the second direction and including at least a portion disposed on the first electrode; and
   a second contact electrode having a shape extending in the third direction, spaced apart from the first contact electrode in a fourth direction intersecting the third direction, and including at least a portion disposed on the second electrode, wherein
   the first contact electrode electrically contacts a side of the light-emitting element, and
   the second contact electrode electrically contacts another side of the light-emitting element.

2. The display device of claim 1, wherein each of the first contact electrode and the second contact electrode has a shape extending in the third direction that forms an inclination angle with the first direction in which the first electrode and the second electrode extend.

3. The display device of claim 2, wherein the inclination angle is in a range of about 10° to about 80°.

4. The display device of claim 1, wherein
   the light-emitting element includes a first end surface and a second end surface in the one direction,
   the first contact electrode electrically contacts a portion of the first end surface, and
   the second contact electrode electrically contacts a portion of the second end surface.

5. The display device of claim 4, wherein
   the light-emitting element includes a third end surface and a fourth end surface in another direction intersecting the one direction,
   the first contact electrode partially and electrically contacts the third end surface, and
   the second contact electrode partially and electrically contacts the fourth end surface.

6. The display device of claim 5, wherein
   the light-emitting element includes:
      a first semiconductor layer;
      a second semiconductor layer; and
      an active layer disposed between the first semiconductor layer and the second semiconductor layer, and
   the light-emitting element includes:
      a first light-emitting element disposed such that a surface of an active layer of the first light-emitting element facing the first direction; and a second light-emitting element disposed such that a surface of an active layer of the second light-emitting element facing the second direction.

7. The display device of claim 6, wherein a lower surface of a first semiconductor layer of the first light-emitting element includes the second end surface electrically contacting the second contact electrode.

8. The display device of claim 6, wherein a lower surface of a first semiconductor layer of the second light-emitting element includes the fourth end surface electrically contacting the second contact electrode in the second light-emitting element.

9. The display device of claim 1, wherein
a first length in the first direction and a second length in the second direction are defined in the light-emitting element, and
a separation distance between the first contact electrode and the second contact electrode satisfies, $$DC \leq LD \sin \theta c + HD \cos \theta c - 2LCD \sin \theta c$$

wherein, "DC" is the separation distance between the first contact electrode and the second contact electrode, "LD" is the first length of the light-emitting element, "HD" is the second length of the light-emitting element, "LCD" is a length of a contact area in which an end surface of the light-emitting element electrically contacts the contact electrode, and "θc" is an inclination angle between an extending direction of the contact electrode and an extending direction of the electrode.

10. The display device of claim 9, wherein the second length of the light-emitting element is greater than a separation distance between the first electrode and the second electrode.

11. The display device of claim 9, wherein the first length is equal to the second length in the light-emitting element.

12. The display device of claim 11, wherein a width of each of the first contact electrode and the second contact electrode is greater than a value obtained by dividing the length of the contact area by a sine value of the inclination angle.

13. The display device of claim 11, wherein a length of each of the first contact electrode and the second contact electrode is greater than a value obtained by dividing the length of the contact area by a cosine value of the inclination angle.

14. The display device of claim 9, wherein the first length is greater than the second length in the light-emitting element.

15. A display device comprising:
a first electrode including a portion extending in a first direction;
a second electrode including a portion extending in the first direction and spaced apart from and facing the first electrode in a second direction intersecting the first direction;
a light-emitting element disposed between the first electrode and the second electrode;
a first contact electrode having a shape extending in a third direction that forms an inclination angle with the first direction, the first contact electrode including at least a portion disposed on the first electrode; and
a second contact electrode having a shape extending in the third direction, spaced apart from the first contact electrode, the second contact electrode including at least a portion disposed on the second electrode, wherein the first contact electrode electrically contact a side of the light-emitting element,
the second contact electrode electrically contacts another side of the light-emitting element, and
the inclination angle is in a range of about 10° to about 80°.

16. The display device of claim 15, wherein
the first electrode includes:
a first electrode expansion portion; and
a first electrode connection portion, a width of the first electrode connection portion in the second direction being less than a width of the first electrode expansion portion in the second direction,
the second electrode includes:
a second electrode expansion portion; and
a second electrode connection portion, a width of the second electrode expansion portion in the second direction being less than a width of the second electrode expansion portion in the second direction, and
a first separation distance between the first electrode expansion portion and the second electrode expansion portion is less than a second separation distance between the first electrode connection portion and the second electrode connection portion.

17. The display device of claim 16, wherein
the light-emitting element is disposed between the first electrode expansion portion and the second electrode expansion portion,
the first contact electrode electrically contacts the side of the light-emitting element on the first electrode expansion portion, and
the second contact electrode electrically contacts the another side of the light-emitting element on the second electrode expansion portion.

18. The display device of claim 17, wherein a length of each of the first electrode expansion portion and the second electrode expansion portion, in the first direction, is greater than a length of the light-emitting element in the first direction and less than a sum of a length of the light-emitting element and a length of a portion in which an end surface of the light-emitting element electrically contacts the first contact electrode.

19. The display device of claim 15, wherein
the first electrode includes:
a first electrode extension portion extending in the first direction; and
a first electrode bent portion bent in the second direction from the first electrode extension portion,
the first electrode extension portion is spaced apart from the second electrode in the second direction,
at least a portion of the first electrode bent portion overlaps the second electrode in a thickness direction, and
the light-emitting element is disposed between the first electrode extension portion, the first electrode bent portion, and the second electrode.

20. The display device of claim 19, wherein
the second electrode includes:
a second electrode extension portion extending in the first direction; and
a second electrode bent portion bent in the second direction from the second electrode extension portion,
the second electrode extension portion is spaced apart from the first electrode extension portion, the second electrode bent portion is spaced apart from the first electrode bent portion, and the light-emitting element is disposed between the first electrode bent portion and the second electrode bent portion.

* * * * *